United States Patent
Fukunaga et al.

[11] Patent Number: 6,005,278
[45] Date of Patent: Dec. 21, 1999

[54] DIVIDED PHOTODIODE

[75] Inventors: Naoki Fukunaga; Takahiro Takimoto, both of Tenri; Masaru Kubo, Kitakatsuragi-gun, all of Japan

[73] Assignee: Sharp Kabushiki Kaisha, Osaka, Japan

[21] Appl. No.: 09/012,820

[22] Filed: Jan. 23, 1998

[30] Foreign Application Priority Data

Jan. 27, 1997 [JP] Japan ..................... 9-012938

[51] Int. Cl.⁶ .................................. H01L 31/00
[52] U.S. Cl. .................. 257/446; 257/443; 257/448
[58] Field of Search .................... 257/461, 446, 257/448, 465, 464, 431, 433

[56] References Cited

U.S. PATENT DOCUMENTS

| | | | |
|---|---|---|---|
| 5,283,460 | 2/1994 | Mita | 257/432 |
| 5,466,962 | 11/1995 | Yamamoto et al. | 257/437 |
| 5,602,415 | 2/1997 | Kubo et al. | 257/443 |

FOREIGN PATENT DOCUMENTS

| | | |
|---|---|---|
| 61-154063 | 7/1986 | Japan . |
| 63-174357 | 7/1988 | Japan . |
| 4-271172 | 9/1992 | Japan . |
| 6-13643 | 1/1994 | Japan . |
| 8-32100 | 2/1996 | Japan . |
| 9-153605 | 6/1997 | Japan . |
| 9-162436 | 6/1997 | Japan . |

*Primary Examiner*—Jerome Jackson, Jr.
*Assistant Examiner*—Bradley William Baumeister
*Attorney, Agent, or Firm*—Nixon & Vanderhye P.C.

[57] ABSTRACT

A divided photodiode includes a semiconductor substrate; a semiconductor layer formed on a surface of the semiconductor substrate; and a plurality of isolating diffusion regions formed in a plurality of regions in the semiconductor layer so as to respectively extend from a surface of the semiconductor layer opposite to the other surface thereof in contact with a surface of the semiconductor substrate and to reach regions under the surface of the semiconductor substrate, thereby dividing the semiconductor layer into at least three semiconductor regions. A first buried diffusion region is further formed under the other isolating diffusion regions except for a particular one located in an isolating section in a combination of a plurality of the semiconductor regions which are adjacent to each other via the isolating section, and a depletion of the semiconductor substrate in a region under the other isolating diffusion region by the application of a reverse bias thereto is suppressed.

16 Claims, 25 Drawing Sheets

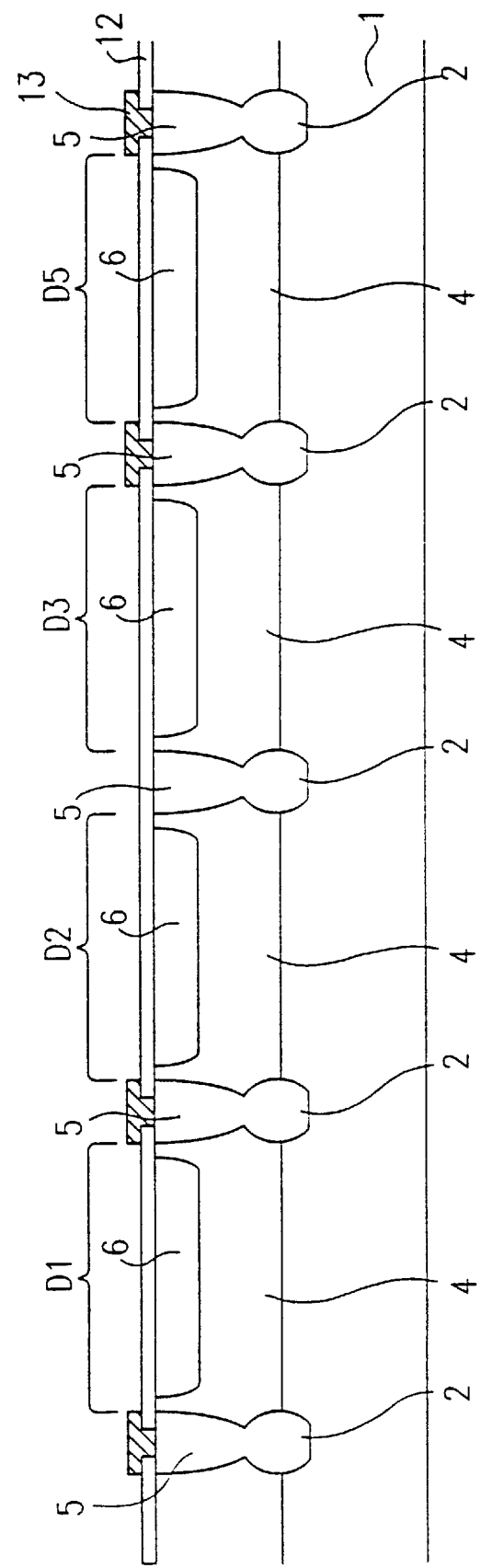

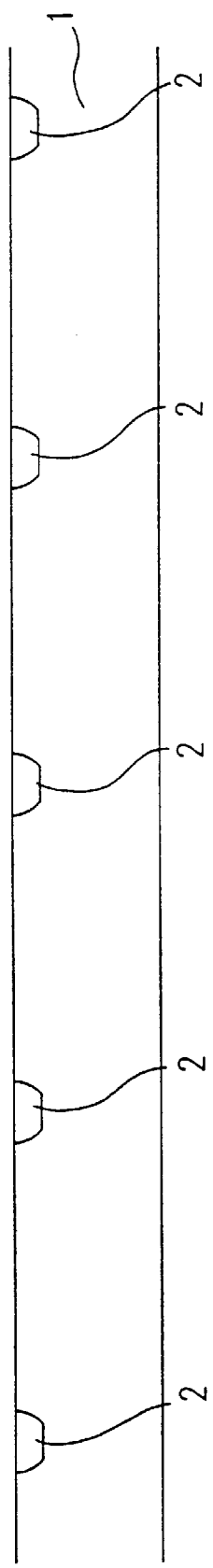
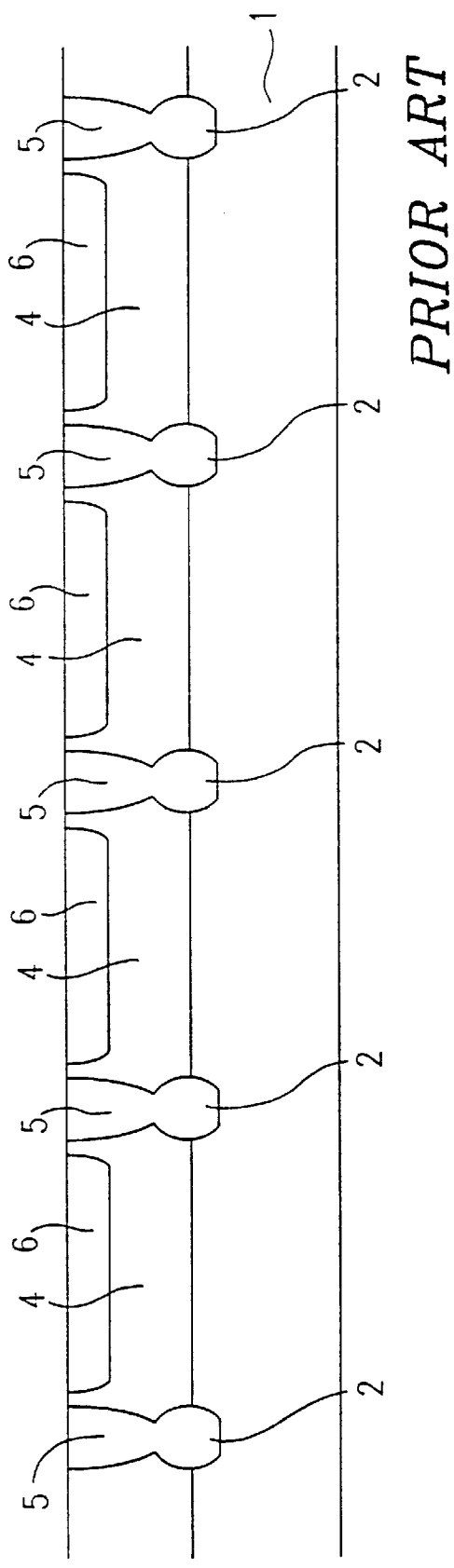
FIG.20A PRIOR ART
FIG.20B PRIOR ART

PRIOR ART

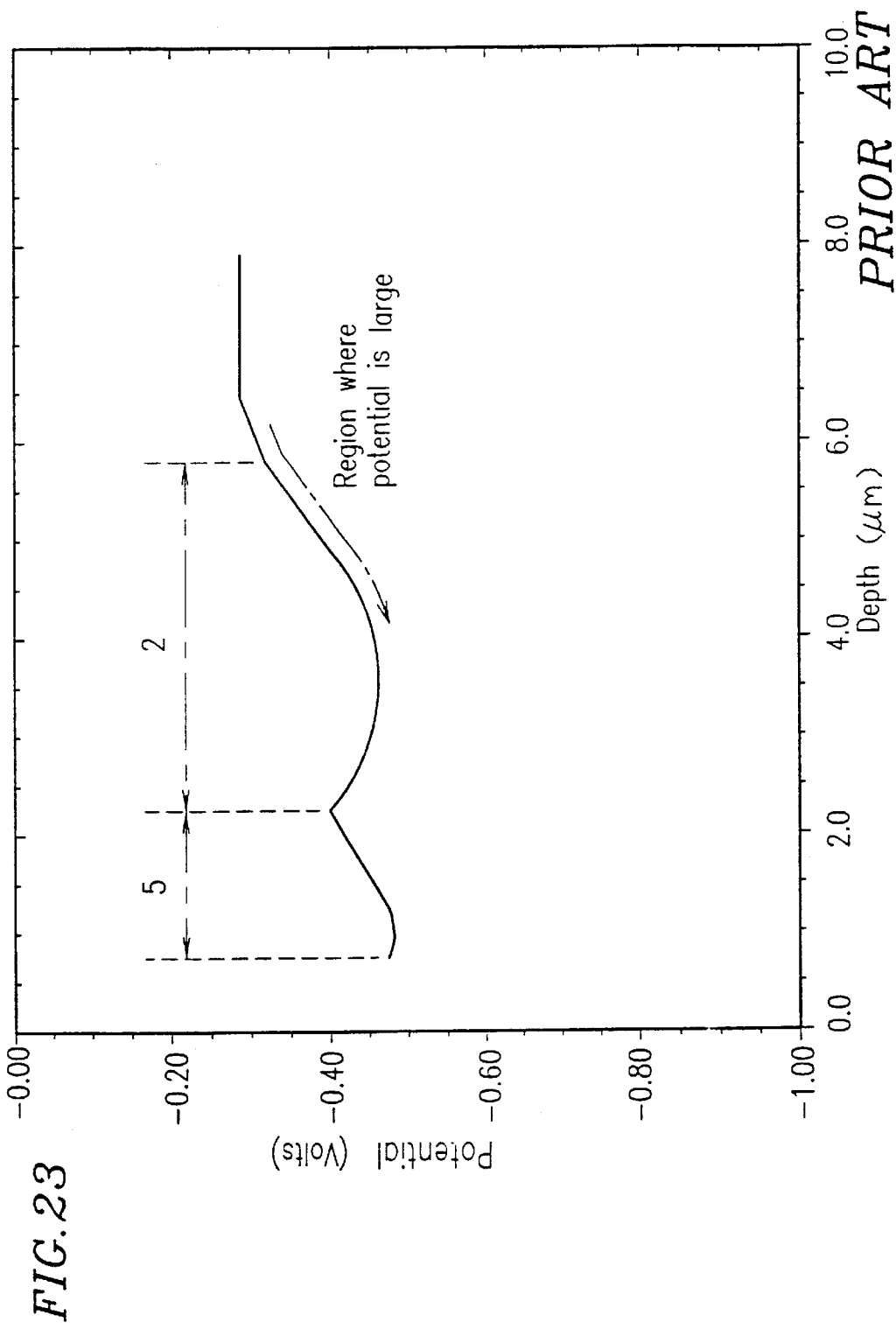

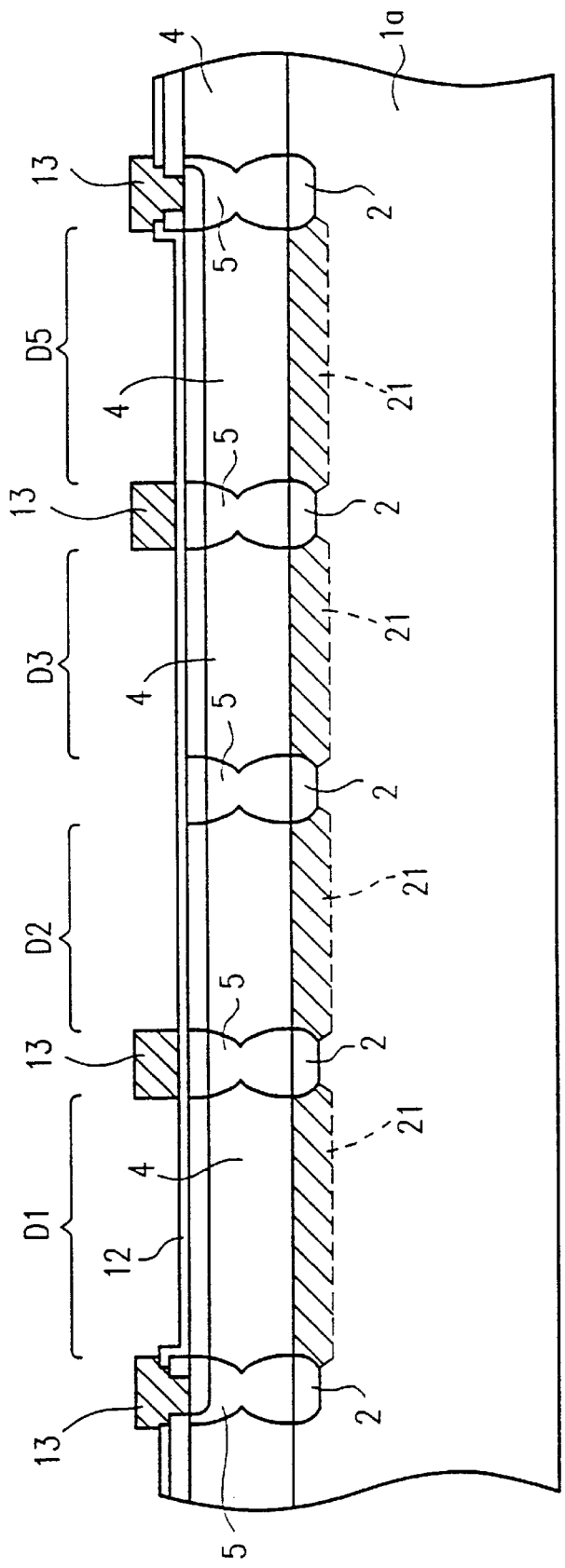

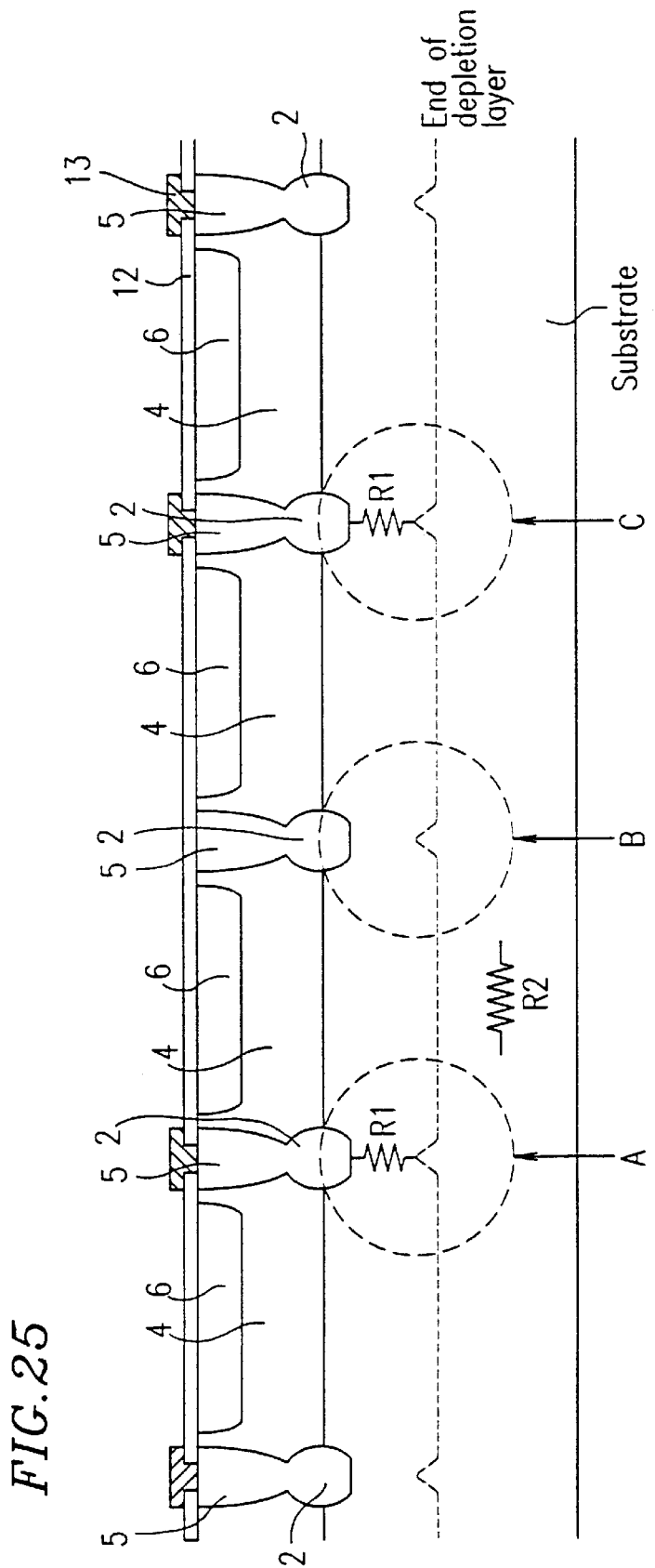

DIVIDED PHOTODIODE

BACKGROUND OF THE INVENTION

1. Field of the Invention

The present invention relates to a divided photodiode incorporated into a light-receiving element used for an optical pickup device or the like. More particularly, the present invention relates to a divided photodiode having a structure which can provide an improved response speed therefor.

2. Description of the Related Art

An optical pickup device is used for various types of optical disk apparatus including those used for a CD-ROM, a DVD and the like. In recent years, a DVD, in particular, has been developed more and more actively and rapidly. Such optical disk apparatus are now required to process a large amount of data necessary for storing a moving picture and the like. In addition, it is very probable that a DVD having a response speed twice or even four times as fast as that of a currently available DVD will be developed in the near future. In view of these circumstances, there is a strong demand for realizing an even higher response speed of an optical pickup device.

A divided photodiode element, in which a light-receiving region is divided into a plurality of light detecting sections, has conventionally been used as a signal detector element for an optical pickup device.

As high-performance optical disk apparatus of smaller size have been realized in recent years, it has become increasingly important to reduce the size and weight of an optical pickup device. In order to realize such an optical pickup device, an optical module including a single hologram element, into which a tracking beam generation portion, a light branching portion and an error signal generation portion have been integrated, has been proposed. The optical module is provided on a top surface of an integrated single package incorporating a laser diode, a photodiode and the like in the inside thereof.

FIG. 18 shows a schematic arrangement of an optical system for an optical pickup device including such an optical module.

Hereinafter, the signal detection principle of the optical system will be briefly described. Light emitted from a laser diode LD is split by a tracking beam generating diffraction grating 30, which is formed under the lower surface of a hologram element 31, into three optical beams. i.e., two sub-beams used for tracking and one main beam for reading out an information signal. Then, the light beams are transmitted through the hologram element 31 formed on the upper surface of the package as zero-order light, transformed by a collimator lens 32 into parallel light beams and then converged by an objective lens 33 onto a disk 34.

The light is reflected from the disk 34 with being modulated by the pits formed on the disk 34, transmitted through the objective lens 33 and the collimator lens 32, and then diffracted by the hologram element 31 so as to be guided as first-order diffracted light beams onto a five-divided photodiode PD, on which five divided light-detecting sections D1 to D5 (hereinafter, also referred to as "light-detecting photodiode sections D1 to D5") are formed.

The hologram element 31 includes two regions 31a and 31b having respectively different diffraction periods. When the reflected light of the main beam is incident onto one of the two regions, the light is converged onto an isolating section which isolates the light-detecting sections D2 and D3 from each other. On the other hand, when the reflected light of the main beam is incident onto the other region of the hologram element 31, the light is converged onto the light-detecting section D4. The reflected light beams of the two subbeams are converged by the hologram element 31 onto the light-detecting sections D1 and D5, respectively.

In this optical system, the incidence positions of the reflected main beams on the photodiode PD are moved along the longitudinal direction of the pair of light-detecting photodiode sections D2 and D3 in accordance with the variation of a distance between the hologram element 31 and the disk 34. In the case where the main beam is in focus on the disk 34, the reflected light beam thereof is incident onto the isolating section between the pair of light-detecting sections D2 and D3 of the photodiode PD.

Thus, assuming that the outputs of the light-detecting sections D1 to D5 of the five-divided photodiode PD are denoted by S1 to S5, respectively, a focus error signal FES is given by the equation: FES=S2−S3.

On the other hand, a tracking error is detected by a so-called "three-beam method". Since the two subbeams for tracking are converged onto the light-detecting sections D1 and D5, respectively, a tracking error signal TES is given by the equation: TES=S1−S5. Thus, when the tracking error signal TES is zero, the main beam is correctly located on the target track which is intended to be irradiated with the main beam.

Furthermore, a reproduced signal RF is given as a sum of the outputs of the light-detecting sections D2 to D4 for receiving the reflected light of the main beam, based on the equation: RF=S2+S3+S4.

FIG. 19 is a cross-sectional view taken along the line a-a' of the conventional light-detecting divided photodiode shown in FIG. 18. It is noted that various components including multi-layer wires, protective films and the like to be formed during the respective process steps succeeding a metal wire processing step are omitted in FIG. 19. In FIG. 19, D1, D2, D3 and D5 denote the light-detecting sections.

Hereinafter, a method for fabricating the divided photodiode will be described with reference to the cross-sectional views shown in FIGS. 20A and 20B. In FIG. 19 and FIGS. 20A and 20B, the same components are identified by the same reference numerals.

First, as shown in FIG. 20A, P-type isolating diffusion regions 2 are formed in the regions in a P-type semiconductor substrate 1 which are to be the isolating sections for isolating the light-detecting sections D1 to D5 from each other.

Next, as shown in FIG. 20B, an N-type epitaxial layer 4 is formed over the entire surface of the P-type semiconductor substrate 1. Then, P-type isolating diffusion regions 5 are formed in the regions, corresponding to the respective P-type isolating diffusion regions 2, in the N-type epitaxial layer 4. These P-type isolating diffusion regions 5 are formed so as to vertically extend from the surface of the N-type epitaxial layer 4 to reach the upper part of the P-type isolating diffusion regions 2. In other words, each pair of P-type isolating diffusion regions which consists of the regions 2 and 5 is formed so as to range from the surface of the N-type epitaxial layer 4 to the surface of the P-type semiconductor substrate 1. As a result, the N-type epitaxial layer 4 is divided into a plurality of (four, in the example shown in FIG. 20B) electrically isolated N-type semiconductor regions, so that the respective light-detecting sections D1 to D5 are formed (though the light-detecting section D4 is not shown in FIG. 20B).

Next, N-type diffusion regions 6 are formed in the respective sections of the divided photodiode in the surface of the N-type epitaxial layer 4. The serial resistance of the photodiode is reduced by these N-type diffusion regions 6. As a result, a CR time constant thereof is reduced and thus high-speed response characteristics are realized.

Thereafter, as shown in FIG. 19, an oxide film 12 having through holes is formed on the N-type epitaxial layer 4 including these N-type diffusion regions 6, and electrodes 13 are formed on the oxide film 12. In this manner, the conventional light-detecting divided photodiode shown in FIG. 19, in which each of the electrodes 13 is electrically connected to an associated one of the isolating diffusion regions 5 via an associated one of the through holes, can be formed.

A high-speed operation is required for the light-detecting sections D2, D3 and D4 for processing the reproduced signal RF. In the case where a light beam is irradiated onto the isolating section between the light-detecting sections D2 and D3, the light-detecting sections D2 and D3, in particular, are required to be operated at an even higher speed. However, in the case where a light beam is irradiated onto the isolating section between these light-detecting sections D2 and D3, the cutoff frequency of the divided photodiode PD is decreased as compared with the case where a light beam is irradiated onto the center of the light-detecting section D2 or D3. Herein, the cutoff frequency means a frequency at which a gain is decreased by about 3 dB as compared with a gain in a low frequency region.

The experimental results demonstrating the decrease in cutoff frequency of the divided photodiode PD are shown in FIGS. 21A and 21B.

FIG. 21A is a cross-sectional view showing the vicinity of the pair of light-detecting sections D2 and D3 of the divided photodiode PD shown in FIG. 19. On the other hand, FIG. 21B is a graph showing the dependence of the cutoff frequency of the divided photodiode PD upon the position of a light beam. In FIG. 21B, the axis of abscissas represents the positions of the light beams of the diffracted light which have been incident in the vicinity of the light-detecting sections D2 and D3, and the axis of ordinates represent the cutoff frequencies fc (MHz) at the respective positions. The measurement results shown in FIG. 21B are obtained under the conditions where the specific resistance of the P-type semiconductor substrate 1 is set at about 15 Ωcm, the reverse bias applied to the photodiode is set at about 1.5 V and the load resistance is set at about 380Ω.

As can be understood from FIG. 21B, when the incident light beam is located in the vicinity of the isolating section between the pair of light-detecting sections D2 and D3, the cutoff frequency fc is decreased as compared with the case where the light beam is located in the center of the light-detecting section D2 or D3. In the case where the light beam is incident onto the isolating section between the light-detecting sections D2 and D3, the cutoff frequency has a value slightly larger than 20 MHz. Thus, the photodiode having such a cutoff frequency can be adapted to a DVD. However, the photodiode cannot be operated with an even higher response speed for a double-speed DVD, a quadruple-speed DVD or the like.

The cutoff frequency is decreased when a light beam is incident onto the isolating section between the light-detecting section D2 and D3, because the optical carriers, which have been generated in the region of the P-type semiconductor substrate 1 under the P-type isolating diffusion region 2, make a detour around the P-type isolating diffusion region 2 to reach a depletion layer formed in a P-N junction between the N-type epitaxial layer 4 and the P-type semiconductor substrate 1. More specifically, since the optical carriers, which have been generated under the P-type isolating diffusion region 2, are required to diffusively move over a distance of about several tens of $\mu$m. Such a long movement distance decreases the cutoff frequency of the photodiode.

FIG. 22 shows the results of the simulation performed for obtaining current paths in the P-type isolating diffusion region 2 and in the vicinity thereof corresponding to the isolating section between the light-detecting sections D2 and D3, in which the directions of the current are indicated by arrows. In FIG. 22, the position represented by an ordinate of 0 $\mu$m corresponds to the surface of the substrate, and the lower end of the P-type isolating diffusion region 2 is located under the surface of the substrate.

The electrons functioning as optical carriers move in the opposite directions to those indicated by the arrows in FIG. 22. As can be understood from FIG. 22, the optical carriers make a detour around the P-type isolating diffusion region 2 functioning as the isolating section to reach the depletion layer existing in the P-N junction formed between the N-type epitaxial layer 4 and the P-type semiconductor substrate 1.

FIG. 23 is a graph showing the potential distribution in the isolating section between adjacent light-detecting sections in the depth direction. In FIG. 23, the axis of ordinates represents a potential (Volts) and the axis of abscissas represents a depth ($\mu$m) from the surface of the substrate. The region 5 corresponds to the P-type isolating diffusion region 5 and the region 2 corresponds to the P-type isolating diffusion region 2.

As can be understood from FIG. 23, in this potential distribution, the P-type isolating diffusion region 2 has a large potential, thereby functioning as a potential barrier against the electrons which are the optical carriers moving in the substrate 1 toward the surface thereof. Therefore, as shown in FIG. 22, the optical carriers move while making a detour around the P-type isolating diffusion region 2.

Typically, the specific resistance of a commonly used P-type semiconductor substrate 1 is about 15 Ωcm. Thus, in the case where the reverse bias of about 1.5 V is applied to the light-detecting photodiode sections constituting the respective light-detecting sections is about 1.5 V, the distance over which the optical carriers run while making a detour becomes about several tens of $\mu$m as shown in FIG. 22.

In order to solve the above problems, various measures have been taken.

For example, a divided photodiode having such a structure as that shown in FIG. 24 is suggested in Japanese Patent Application No. 8-166284 (corresponding to Japanese Laid-Open Publication No. 9-153605).

The divided photodiode shown in FIG. 24 uses a substrate having a high specific resistance as the P-type semiconductor substrate 1, unlike the conventional divided photodiode shown in FIG. 19. Thus, when a reverse bias at an equal level is applied to the photodiodes shown in FIGS. 19 and 24, the area of the depletion layer 21 expanding in the P-N junction between the N-type epitaxial layer 4 and the P-type semiconductor substrate 1a in the photodiode shown in FIG. 24 becomes larger as compared with the photodiode shown in FIG. 19. Accordingly, the depletion layer expands to a larger degree toward the region below the P-type isolating diffusion region 2 located in the isolating section between the light-detecting sections D2 and D3. As a result, the distance over which the optical carriers generated in the P-type semiconductor substrate 1 under the P-type isolating diffusion region 2 run while making a detour around the P-type isolating diffusion region 2, is shortened. Consequently, the response speed and the cutoff frequency of the photodiode are increased. The higher the specific resistance of the substrate is set to be, the shorter the running distance of the optical carriers can be and the higher the response speed of the photodiode can be.

However, as a result of more detailed researches, the present inventors found that the response speed cannot always be satisfactorily increased merely by increasing the specific resistance of the substrate.

SUMMARY OF THE INVENTION

A divided photodiode of the present invention includes: a semiconductor substrate of a first conductivity type; a semiconductor layer of a second conductivity type, the semiconductor layer being formed on a surface of the semiconductor substrate; and a plurality of isolating diffusion regions of the first conductivity type. Each of the isolating diffusion regions is constituted by at least one layer, and the plurality of isolating diffusion regions being formed in a plurality of regions in the semiconductor layer so as to respectively extend from a surface of the semiconductor layer opposite to the other surface thereof in contact with a surface of the semiconductor substrate and to reach regions under the surface of the semiconductor substrate, and the plurality of isolating diffusion regions dividing the semiconductor layer into at least three semiconductor regions of the second conductivity type. Light is irradiated onto the vicinity of an isolating section in a combination of a plurality of the semiconductor regions, which are adjacent to each other via the isolating section, of the at least three semiconductor regions which have been divided by the plurality of isolating diffusion regions, while light is irradiated substantially onto a center of the semiconductor region other than the combination of the plurality of the semiconductor regions. A first buried diffusion region of the first conductivity type is further formed under the other isolating diffusion regions except for a particular one located in the isolating section in the combination of the plurality of the semiconductor regions, and a depletion of the semiconductor substrate in a region under the other isolating diffusion region by the application of a reverse bias thereto is suppressed.

Preferably, the formation of the first buried diffusion region is omitted in the region under the particular isolating diffusion region located in the isolating section in the combination of the plurality of the semiconductor regions.

Preferably, the semiconductor substrate has a specific resistance of about 100 Ωcm or more.

Preferably, a light-blocking film for suppressing irradiation of stray light onto the first buried diffusion region is formed over the other isolating diffusion region under which the first buried diffusion region is formed.

Preferably, the first buried diffusion region is formed so as to have a diffusion depth Xj equal to or larger than about 5 μm.

Preferably, the first buried diffusion region is formed so as to have a surface concentration of about $1 \times 10^{17}$ atoms/cm$^3$ or less.

Preferably, the first buried diffusion region and the other isolating diffusion region are formed so as to have a concentration of about $5 \times 10^{14}$ atoms/cm$^3$ or more in a contact region between the first buried diffusion region and the other isolating diffusion region.

Preferably, the first buried diffusion region and the other isolating diffusion region are formed by contacting one end of the first buried diffusion region with one end of the other isolating diffusion region located closer to the particular isolating diffusion region located in the isolating section.

It is possible to have such a configuration that the semiconductor substrate and the semiconductor layer exist in a range wider than the at least three semiconductor regions, and that a signal processor is formed outside of the at least three semiconductor regions.

It is also possible to have such a configuration that the signal processor comprises a second buried diffusion region of the first conductivity type, and that the second buried diffusion region is formed simultaneously with the first buried diffusion region.

It is further possible to have such a configuration that an impurity concentration of the semiconductor layer of the second conductivity type is set at about $5 \times 10^{15}$ atoms/cm$^3$ or more so as to prevent boron autodoping from the first buried diffusion region.

Another divided photodiode of the present invention includes: a semiconductor substrate of a first conductivity type; a semiconductor layer of a second conductivity type, the semiconductor layer being formed on a surface of the semiconductor substrate; and a plurality of isolating diffusion regions of the first conductivity type. Each of the isolating diffusion regions is constituted by at least one layer, and the plurality of isolating diffusion regions are formed in a plurality of regions in the semiconductor layer so as to respectively extend from a surface of the semiconductor layer opposite to the other surface thereof in contact with a surface of the semiconductor substrate and to reach regions under the surface of the semiconductor substrate, and the plurality of isolating diffusion regions dividing the semiconductor layer into at least three semiconductor regions of the second conductivity type. Light is irradiated onto the vicinity of an isolating section in a combination of a plurality of the semiconductor regions, which are adjacent to each other via the isolating section, of the at least three semiconductor regions which have been divided by the plurality of isolating diffusion regions, while light is irradiated substantially onto a center of the semiconductor region other than the combination of the plurality of the semiconductor regions. A particular one of the isolating diffusion regions which is located in the isolating section in the combination of the plurality of the semiconductor regions is formed so as to reach a shallow level under the surface of the semiconductor substrate, and the other isolating diffusion region is formed so as to reach a deep level under the surface of the semiconductor substrate.

It is possible to have such a configuration that the semiconductor substrate and the semiconductor layer exist in a range wider than the at least three semiconductor regions, and a signal processor is formed outside of the at least three semiconductor regions.

It is also possible to have such a configuration that the signal processor comprises a buried diffusion region of the first conductivity type.

Thus, the invention described herein makes possible the advantage of providing a divided photodiode which can increase the response speed thereof with certainty.

This and other advantages of the present invention will become apparent to those skilled in the art upon reading and understanding the following detailed description with reference to the accompanying figures.

BRIEF DESCRIPTION OF THE DRAWINGS

FIG. 19 is a cross-sectional view showing a structure of a conventional divided photodiode.

FIGS. 20A and 20B are cross-sectional views showing the process steps for fabricating the divided photodiode shown in FIG. 19.

FIG. 23 is a graph showing the results of a device simulation about a potential distribution in the isolating section in the depth direction for the divided photodiode shown in FIG. 19.

FIG. 24 is a cross-sectional view showing another structure of a conventional divided photodiode.

FIG. 25 is a cross-sectional view showing the serial resistance of the divided photodiode shown in FIG. 19.

DESCRIPTION OF THE PREFERRED EMBODIMENTS

Figure 1:
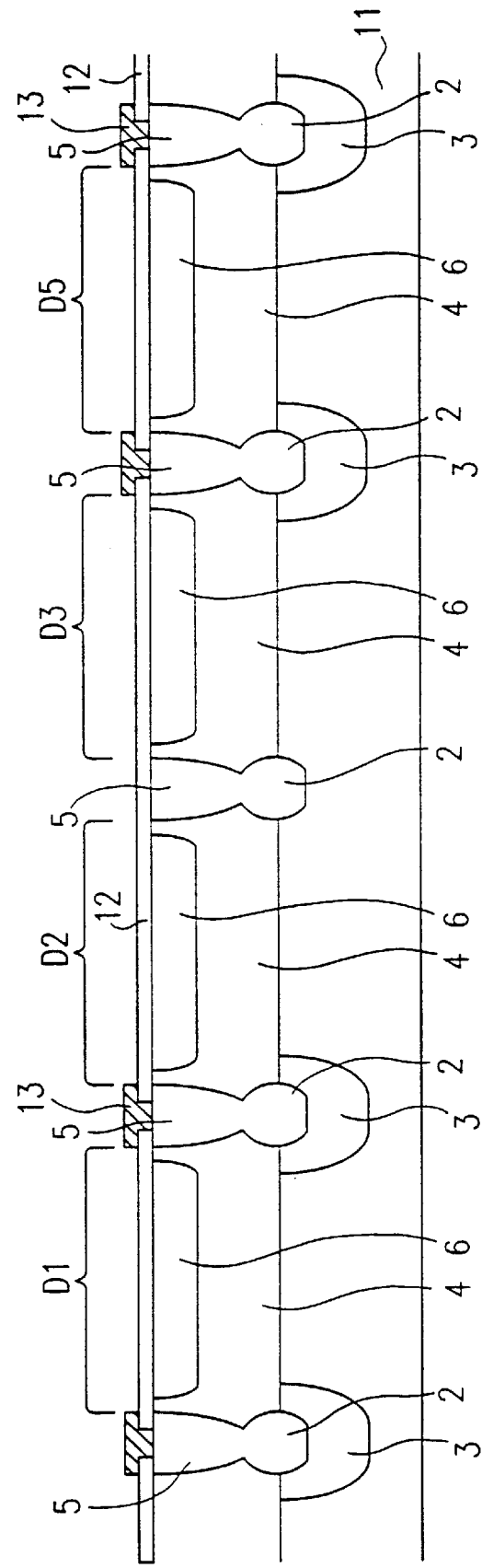
FIG. 1 is a cross-sectional view showing the structure of a divided photodiode in a first example of the present invention.

As described above, the response speed of a divided photodiode can be increased by increasing the specific resistance of a substrate. However, as a result of more detailed experiments, the present inventors have confirmed that if the specific resistance of the substrate is too high, then some problems are caused. This point will be described with reference to FIG. 25.

As shown in FIG. 25, if a semiconductor substrate having a specific resistance as high as about 500 Ωcm is used, then the area of a depletion layer becomes larger in the region under a P-type isolating diffusion region irradiated with light (e.g., the region B in FIG. 25). As a result, the distance over which the optical carriers run while making a detour around the P-type isolating diffusion region 2 is shortened. However, at the same time, the regions under the P-type isolating diffusion regions, from which substrate potentials of the photodiode are obtained (e.g., the regions A and C in FIG. 25), are also depleted. If the regions of the P-type semiconductor substrate under the P-type isolating diffusion regions (i.e., the regions A and C in FIG. 25) are depleted, then the resistance (i.e., R1 in FIG. 25) is extremely increased in these regions, so that the serial resistance of the photodiode is also increased. Thus, since the CR time constant is increased by the resistance components in these regions, the response speed of the photodiode is decreased.

In addition, if the specific resistance of the substrate is set to be too high, then the resistance components resulting from the specific resistance of the substrate itself (i.e., R2 in FIG. 25) are increased. As a result, the response speed of the photodiode is adversely decreased by the CR time constant associated with the resistance components.

Thus, in order to solve such a problem, the present invention provides buried diffusion regions in the regions of the semiconductor substrate under the isolating diffusion regions, from which the substrate potential of the photodiode is obtained. Thus, the regions of the semiconductor substrate under the isolating diffusion regions are prevented from being depleted by the application of a reverse bias thereto. As a result, it is possible to prevent the serial resistance of the photodiode from being increased by the generation of the depletion layer and to thereby increase the cutoff frequency of the photodiode.

In addition, when light is irradiated onto the isolating section between a pair of semiconductor regions, the depletion layer can be enlarged by increasing the specific resistance of the semiconductor substrate. As a result, the end of the depletion layer largely expands to the region below the isolating diffusion region. In a conventional divided photodiode, the optical carriers move while making a detour around the isolating diffusion region. However, according to the present invention, such a detour of optical carriers can be suppressed, thereby shortening the diffusion movement distance thereof. Consequently, the cutoff frequency of the photodiode can be increased.

Hereinafter, embodiments of the present invention will be described with reference to the accompanying drawings.

EXAMPLE 1

The photodiode in the first example of the present invention will be described with reference to the drawings.

FIG. 1 is a cross-sectional view of the divided photodiode of the first example. It is noted that various components including multi-layer wires, protective films and the like to be formed during the respective process steps succeeding a metal wire processing step are omitted from FIG. 1.

In the divided photodiode, an N-type epitaxial layer 4 is formed as a semiconductor layer on a P-type high-specific resistance semiconductor substrate 11, which is made of, for example, silicon with a high specific resistance of about 500 Ωcm. Pairs of P-type isolating diffusion regions 2 and 5, which extend from an upper surface of the N-type epitaxial layer 4 to reach regions at a level slightly lower than a surface of the semiconductor substrate 11, are formed in a plurality of regions. Each of the P-type isolating diffusion regions 2 is formed so as to extend from the region at a level slightly lower than the surface of the semiconductor substrate 11 and to reach the region in the middle of the N-type epitaxial layer 4. Each of the P-type isolating diffusion regions 5 is formed over the associated isolating diffusion region 2 so as to reach the upper surface of the N-type epitaxial layer 4.

The pairs of P-type isolating diffusion regions 2 and 5 divide the N-type epitaxial layer 4 into a plurality of regions (e.g., four regions in the example shown in FIG. 1) such that these regions are electrically isolated from each other. The outermost regions thereof are also electrically isolated from the adjacent regions. An N-type diffusion region 6 is formed in the upper part of each of the isolated regions of the N-type epitaxial layer 4. The four regions isolated by the pairs of P-type isolating diffusion regions 2 and 5 become the respective light-detecting sections D1, D2, D3 and D5 of the photodiode. The light-detecting sections D1 and D5 are regions from which a tracking error signal TES is to be obtained. In each of the light-detecting sections D1 and D5, light is irradiated substantially onto the center thereof. The light-detecting sections D2 and D3 are regions from which a focus error signal FES is to be obtained. In the light-detecting section D2 and D3, light is irradiated mainly onto the isolating section thereof.

An oxide film 12 is formed on the N-type epitaxial layer 4. Four electrodes 13 for taking out a substrate potential therethrough are provided on the oxide film 12 so as to penetrate the oxide film 12. The electrodes 13 are provided over the isolating diffusion regions 5, except for the isolating diffusion region between the light-detecting sections D2 and D3. The lower end of each of the electrodes 13 reaches the associated P-type isolating diffusion region 5. Furthermore, P-type buried diffusion regions 3 are formed under the isolating diffusion regions 2 corresponding to the P-type isolating diffusion regions 5 on which the electrodes 13 are formed.

Next, a method for fabricating the divided photodiode of the first example having such a structure will be described with reference to the cross-sectional views shown in FIGS. 2A and 2B. It is noted that the same components are identified by the same reference numerals in FIG. 1 and FIGS. 2A and 2B.

Figure 2A:
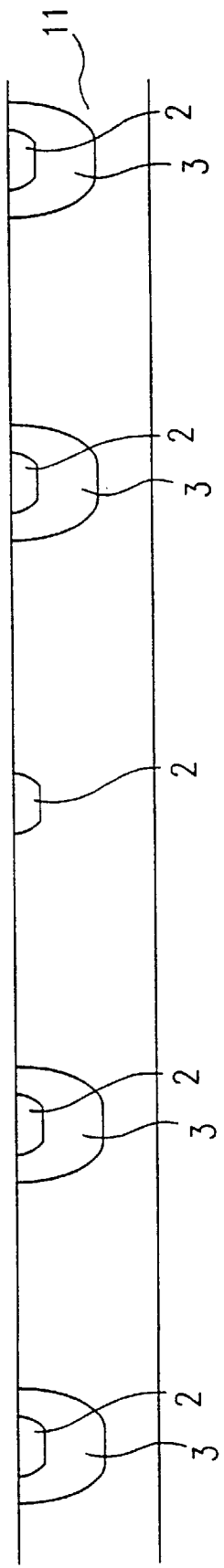
FIGS. 2A and 2B are cross-sectional views showing the process steps for fabricating the divided photodiode shown in FIG. 1.

First, as shown in FIG. 2A, P-type buried diffusion regions 3 are formed under the four regions, for example, corresponding to the isolating diffusion regions from which a substrate potential is obtained, of the five regions isolating the light-detecting sections D1 to D5 from each other in the surface of the P-type high-specific resistance semiconductor substrate 11. Next, P-type isolating diffusion regions 2 are formed in the regions corresponding to the five isolating regions which isolate the light-detecting sections D1 to D5 from each other.

Figure 2B:
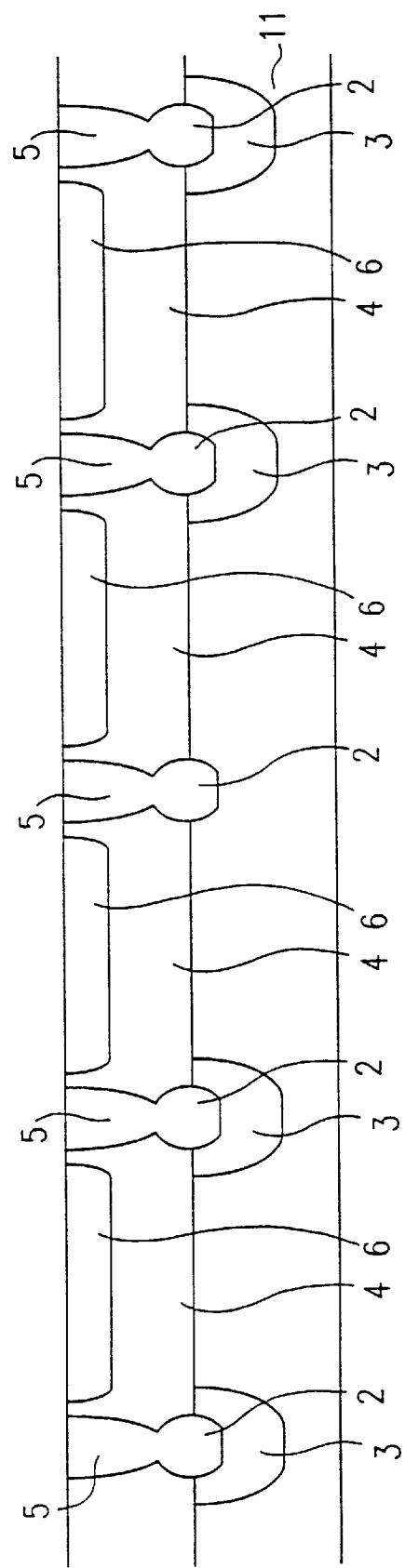

Then, as shown in FIG. 2B, an N-type epitaxial layer 4 is formed over the entire surface of the P-type high-specific resistance semiconductor substrate 11.

Subsequently, P-type isolating diffusion regions 5 are formed in the regions inside the N-type epitaxial layer 4 which correspond to the respective P-type isolating diffusion regions 2. These P-type isolating diffusion regions 5 are formed so as to extend from the upper surface of the N-type epitaxial layer 4 and to reach the respective P-type isolating diffusion regions 2. As a result, the pairs of P-type isolating diffusion regions 2 and 5 are respectively formed so as to extend from the surface of the N-type epitaxial layer 4 and to reach the surface of the P-type semiconductor substrate 11. It is noted that the P-type isolating diffusion regions 2 diffusively expand from the substrate 11 toward the N-type epitaxial layer 4 during this process step. By forming these pairs of P-type isolating diffusion regions 2 and 5, the N-type epitaxial layer 4 is divided into a plurality of electrically isolated N-type semiconductor regions to form the respective light-detecting sections D1 to D5 (note that D4 is not shown in these figures).

Next, N-type diffusion regions 6 are formed in the regions of the N-type epitaxial layer 4 which correspond to the respective light-detecting sections D1 to D5. These N-type diffusion regions 6 are provided for the purposes of reducing the serial resistance of the photodiode, thereby reducing the CR time constant and realizing high-speed response characteristics.

Finally, as shown in FIG. 1, the oxide film 12 and the electrodes 13 are formed, thereby completing the divided photodiode of this example.

In the divided photodiode of this example, the P-type buried diffusion regions 3 are formed under the P-type isolating diffusion regions from which a substrate potential is obtained such that the regions of the P-type high-specific resistance semiconductor substrate 11 under the P-type isolating diffusion regions 2 are not depleted by the application of a reverse bias to the photodiode. Thus, it is possible to prevent the serial resistance of the photodiode from being increased by the formation of depletion layers, enabling to increase the cutoff frequency of the photodiode.

For example, in the photodiode of this example in which the specific resistance of the P-type high-specific resistance semiconductor substrate 11 is about 500 Ωcm, if the reverse bias applied to the photodiode is set at about 1.5 V, then the expansion width of a depletion layer downward in the P-type semiconductor substrate 11 under the P-type isolating diffusion regions 2 becomes about 10 μm. Thus, if the width of the P-type buried diffusion region 3 is larger than about 20 μm, then the problems such as the increase of the serial resistance of the photodiode resulting from the expansion of the depletion layer can be eliminated.

Next, the reasons why the buried diffusion regions 3 are formed under the isolating diffusion regions which are not irradiated with signal light will it be described.

As already described with reference to FIG. 18, in the divided photodiode of the present invention, the incidence position of the reflected main beam on the photodiode PD is moved along the longitudinal direction of the light-detecting sections D2 and D3 in accordance with the distance between the hologram element 31 and the disk 34. Thus, when the main beam is in focus on the disk 34, the reflected light thereof is incident so that the center of the light beam spot is positioned onto the isolating section between the light-detecting sections D2 and D3.

Figure 3:
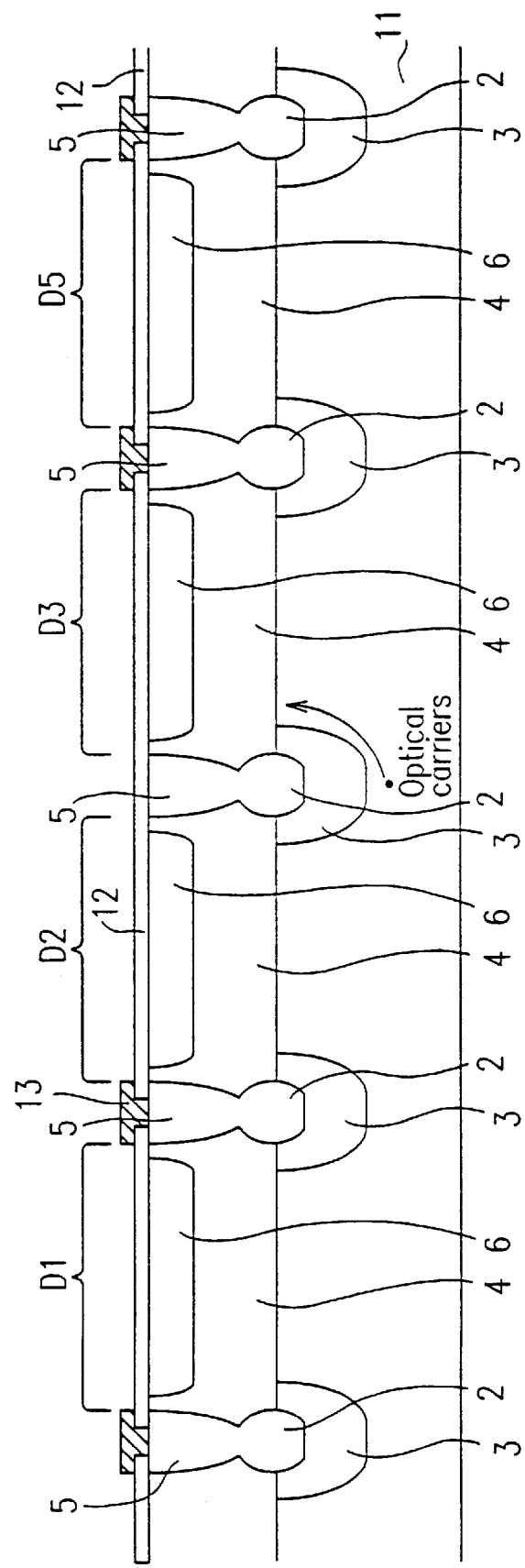
FIG. 3 is a cross-sectional view schematically showing the movement of optical carriers making a detour around a P-type buried diffusion region.
Figure 22:
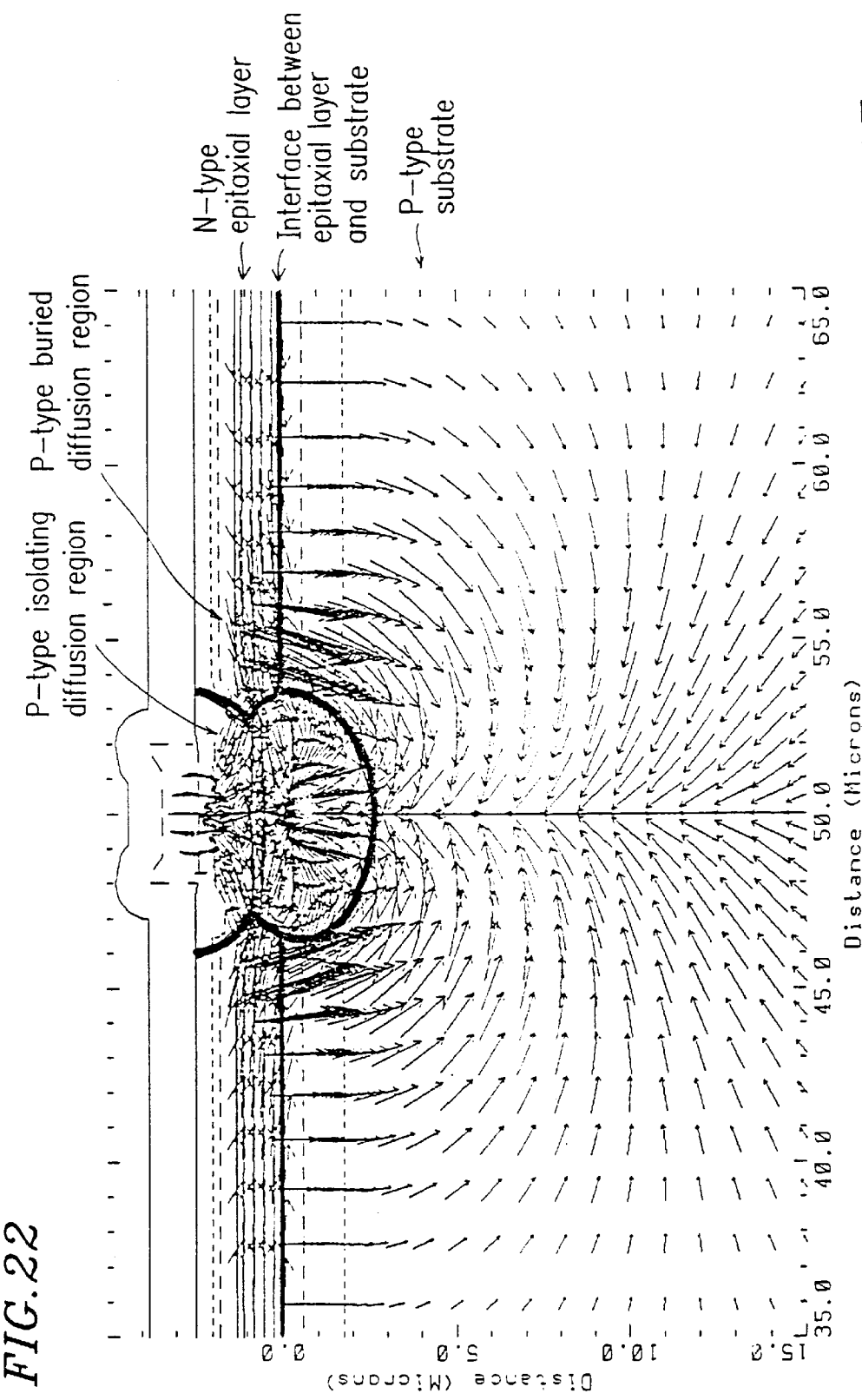
FIG. 22 is a diagram showing the results of a device simulation performed with respect to the divided photodiode shown in FIG. 19 in which a light beam is irradiated onto the vicinity of an isolating section of the divided photodiode.

In this case, as shown in FIG. 3, if the buried diffusion region 3 is also formed under the isolating section between the light-detecting sections D2 and D3 onto which the light is incident, a problematic phenomenon similar to the phenomenon already described with reference to FIGS. 22 and 23 occurs. More specifically, the optical carriers generated under the buried diffusion region 3 make a detour around the buried diffusion region 3 to reach the depletion layer formed in the P-N junction between the N-type epitaxial layer 4 and the P-type high-specific resistance semiconductor substrate 11. Furthermore, since the buried diffusion region 3 is formed so as not to deplete the region of the P-type high-specific resistance semiconductor substrate 11 under the buried diffusion region 3, the buried diffusion region 3 has a larger diffusion depth and a larger lateral expansion width than those of the P-type isolating diffusion region 2 shown in FIGS. 22 and 23.

Figure 4:
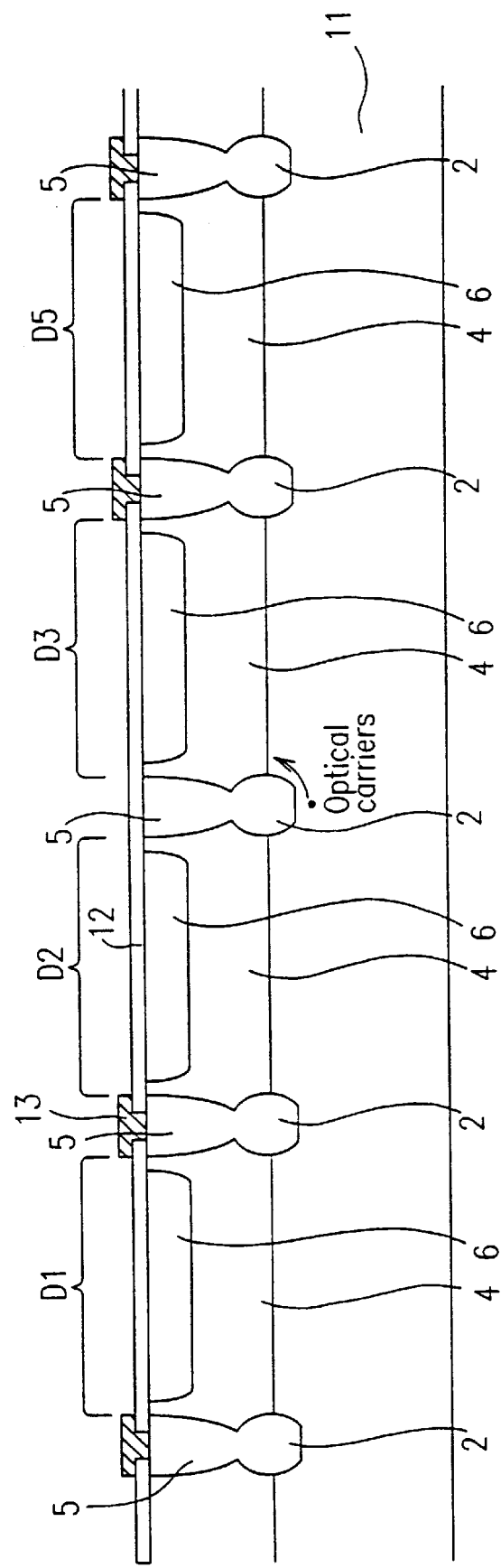
FIG. 4 is a cross-sectional view schematically showing the movement of the optical carriers making a detour around a P-type isolating diffusion region.

Thus, if the buried diffusion region 3 is also formed under the isolating section between the light-detecting sections D2 and D3 which is irradiated with light as shown in FIG. 3, then the distance over which the optical carriers generated under the buried diffusion region 3 move while making a detour around the buried diffusion region 3 becomes longer than the distance over which the optical carriers move while making a detour around the isolating diffusion region 2 in the case where the buried diffusion regions 3 are not formed anywhere, as shown in FIG. 4. As a result, the response speed of the photodiode is remarkably decreased.

Thus, according to the present invention, the buried diffusion regions 3 are formed under all the isolating sections, except for the isolating section existing between the light-detecting sections D2 and D3 onto which the light is irradiated. In such a case, since the P-type buried diffusion regions 3 are formed under the P-type isolating diffusion regions from which the substrate potential of the photodiode is taken as to as to prevent the regions of the P-type high-specific resistance semiconductor substrate 11 under the P-type isolating diffusion regions 2 from being depleted by the application of a reverse bias thereto, it is possible to prevent the serial resistance of the photodiode from being increased by the expansion of the depletion layer and to increase the cutoff frequency of the photodiode.

In this case, by using a substrate having a high specific resistance (e.g., about 500 Ωcm) as the P-type semiconductor substrate 11, the depletion layer expanding in response to the reverse bias applied to the photodiode can be enlarged under the isolating section between the light-detecting sections D2 and D3 onto which the light is irradiated. As a result, the distance over which the optical carriers generated in the region of the P-type semiconductor substrate 11 under the P-type isolating diffusion region 2 run while making a detour around the P-type isolating diffusion region 2 can be shortened. Thus, the response speed and the cutoff frequency of the photodiode can be increased.

Figure 5:
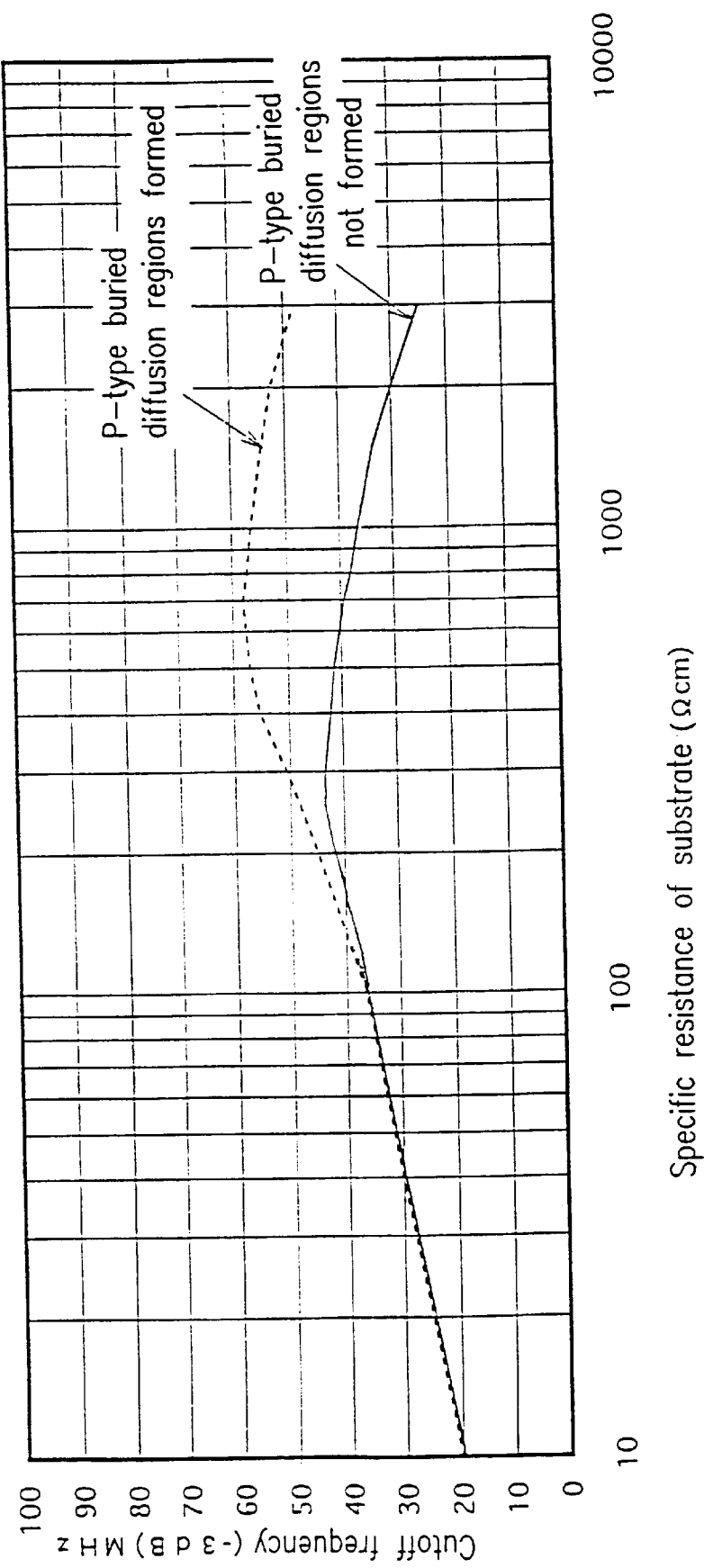
FIG. 5 is a graph showing the effects of the buried diffusion region of the present invention upon the increase of a cutoff frequency.

The effects of the increase of the cutoff frequency are shown in FIG. 5.

FIG. 5 is a graph showing the dependence of the cutoff frequency upon the specific resistance of the substrate for the case where the buried diffusion regions 3 exist in the regions under the isolating diffusion regions from which the substrate potential is taken out and for the case where the buried diffusion regions 3 do not exist there.

As shown in FIG. 5, in the range where the specific resistance of the substrate is equal to or higher than about 100 Ωcm, the higher the specific resistance of the substrate is set to be, the more remarkable the increase of the cutoff frequency become by providing the buried diffusion regions 3.

Next, the diffusion depth Xj of the buried diffusion region 3 will be described.

In the case where the buried diffusion regions 3 are formed so as to have a shallow diffusion depth, the depletion layer is more likely to expand as compared with the case where the diffusion depth of the buried diffusion regions 3 is deep. Thus, the P-type buried diffusion regions 3 are required to have a larger width such that the regions of the P-type high-specific resistance semiconductor substrate 11 under the buried diffusion regions 3 are not depleted. Consequently, if the P-type buried diffusion regions 3 are formed so as to have a shallow diffusion depth, then the size of the photo-diode is required to be increased in order to obtain an effective light-receiving region of a similar size. As a result, chip size is increased and accordingly associated costs also increase. In addition, the increase in size of the photodiode also brings an increase in a capacitance value of the photodiode, thereby undesirably decreasing the response speed thereof.

Thus, according to the present invention, the P-type buried diffusion regions 3 are formed so as to have a diffusion depth Xj equal to or larger than about 5 $\mu$m. As a result, the above-mentioned problem can be eliminated and a divided photodiode exhibiting excellent response characteristics can be provided.

Furthermore, according to the present invention, the buried diffusion regions 3 are formed so as to have a surface concentration of about $1 \times 10^{17}$ atoms/cm$^3$ or less.

Figure 6:
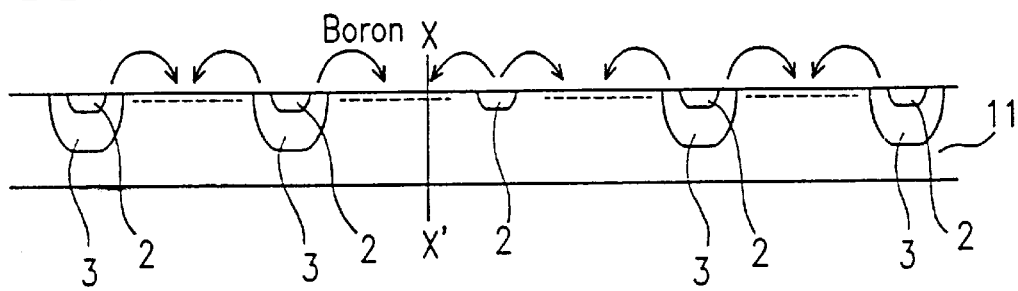
FIG. 6 is a schematic cross-sectional view illustrating a boron autodoping phenomenon.

In an epitaxial growth process for forming the N-type epitaxial layer 4, a boron autodoping phenomenon resulting from the outward diffusion of the impurity from the P-type buried diffusion regions 3 occurs as shown in FIG. 6. When the boron autodoping phenomenon is generated, a high-concentration boron-autodoped layer is formed between the N-type epitaxial layer 4 and the P-type high-specific resistance semiconductor substrate 11. The formation of the high-concentration boron-autodoped layer restricts the expansion of the depletion layer between the N-type epitaxial layer 4 and the P-type high-specific resistance semiconductor substrate 11, thereby increasing the capacitance and adversely decreasing the response speed of the photodiode.

Figure 7:
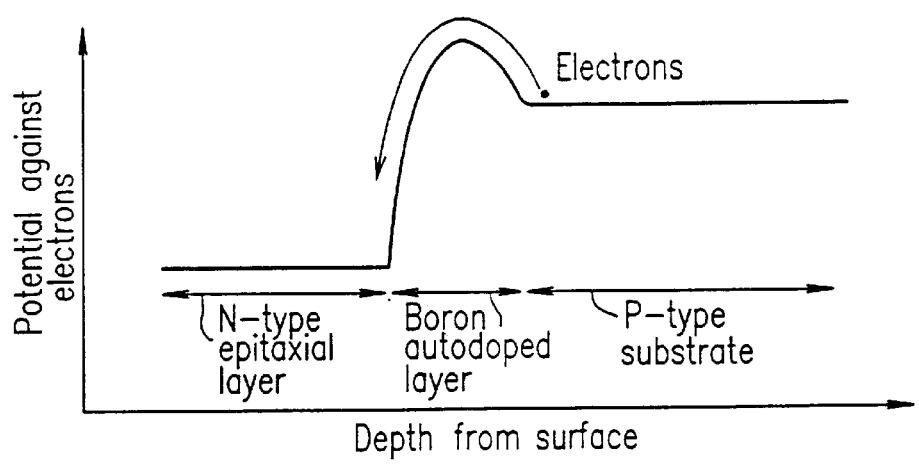
FIG. 7 is a graph showing a potential distribution against electrons in the depth direction in the center region of a photodiode (i.e., an impurity profile taken along the line x-x' in FIG. 6) where boron autodoping has been generated.

In addition, if the high-concentration boron-autodoped layer is formed, then the autodoped layer acts as a potential barrier against the optical carriers (electrons) generated in the P-type high-specific resistance semiconductor substrate 11 as shown in FIG. 7. As a result, the response speed is decreased.

The amount of autodoped boron depends upon the impurity concentration around the surface of the P-type buried diffusion region which is a generation source of the autodoping. Thus, in order to suppress the adverse effects resulting from the generation of the autodoping, it is necessary to reduce the surface impurity concentration of the P-type buried diffusion region.

Herein, the amount of autodoped boron is typically about $1/10^3$ of the surface impurity concentration of the P-type buried diffusion region which is the source of the autodoping. Furthermore, the specific resistance of the P-type high-specific resistance semiconductor substrate 11 is set in the range from about several hundreds of Ωcm to about several thousands of Ωcm. Thus, the impurity concentration in the substrate is approximately in the range from about $1\times10^{13}$ atoms/cm$^3$ to about $1\times10^{14}$ atoms/cm$^3$. Accordingly, in order to suppress the boron autodoping to a negligible level, the surface impurity concentration of the P-type buried diffusion region is preferably set at about $1\times10^{17}$ atoms/cm$^3$ or less.

In addition, according to the present invention, both the P-type buried diffusion region 3 and the P-type isolating diffusion region 2 are formed so as to have an impurity concentration of about $5\times10^{14}$ atoms/cm$^3$ or more in the contact regions therebetween.

The role of the P-type buried diffusion region 3 is to prevent the region of the P-type high-specific resistance semiconductor substrate 11 under the P-type buried diffusion region 3 from being depleted by the application of a reverse bias to the photodiode. Thus, the concentrations in the contact regions between the P-type buried diffusion region 3 and the P-type isolating diffusion region 2 are not required to be higher than necessary. The concentration may be set at any arbitrary value so long as the depletion of the contact regions between the P-type buried diffusion region 3 and the P-type isolating diffusion region 2 can be prevented even when a reverse bias is applied to the photodiode.

In a common semiconductor fabrication process, even if the P-type isolating diffusion region 2 is designed to have a minimum width, the finished width thereof typically becomes about 4 μm because of the lateral diffusion during the subsequent heat treatment process. If the width of the contact regions between the P-type buried diffusion region 3 and the P-type isolating diffusion region 2 is about 4 μm and the reverse bias applied to the photodiode is about 1.5 V, then it is necessary to form the P-type buried diffusion region 3 so as to contact the P-type isolating diffusion region 2 with an impurity concentration of about $5\times10^{14}$ atoms/cm$^3$ or more, in order to prevent the contact regions between the P-type isolating diffusion region 3 and the P-type isolating diffusion region 2 from being depleted. This enables the elimination of the problems in the decrease of the response speed caused by the increase of the serial resistance of the photodiode and the like.

In the foregoing description, the P-type isolating diffusion region 2 is designed so as to have a minimum width. Alternatively, the width of the P-type isolating diffusion region 2 may be larger than the minimum width. In such a case, there occurs no problem if the contact regions between the P-type buried diffusion region 3 and the P-type isolating diffusion region 2 have an impurity concentration of about $5\times10^{14}$ atoms/cm$^3$ or more, and therefore, freedom of design is increased with respect to the depletion.

Moreover, according to the present invention, the specific resistance of the P-type semiconductor substrate 11 is preferably set in the range from about 300 Ωcm to about 2500 Ωcm, both inclusive. The reasons therefor will be described.

The frequency of a signal processed by a DVD is about 4.5 MHz at the maximum rate. The frequencies for a double-speed DVD and a quadruple-speed DVD are about 9.0 MHz and about 18.0 MHz, respectively. Thus, a photodiode for a double-speed DVD is required to have a constant gain in the range from a low frequency up to about 9.0 MHz.

Similarly, a photodiode for a quadruple-speed DVD is required to have a constant gain in the range from a low frequency up to about 18.0 MHz. Thus, in order to be adapted to a quadruple-speed DVD or a DVD having an even higher reproducing speed, a photodiode is required to have a cutoff frequency (at −3 dB) of about 50 MHz or more.

In the light-detecting sections which are irradiated with light during practical use, the higher the specific resistance of the substrate is set to be, the larger the depletion layer becomes and the shorter the running distance of the optical carriers generated outside of the depletion layer, becomes (i.e., the smaller the time constant of the diffusion current components become). As a result, the response speed of the photodiode is increased. However, if the specific resistance of the substrate is set at too high a value, then the resistance components resulting from the specific resistance of the substrate itself increase and the resistance components also increase because of the depletion of the region of the P-type semiconductor substrate 11 under the isolating diffusion region from which the substrate potential is obtained. As a result, the CR time constant is increased and the response speed of the photodiode is decreased. Thus, as shown in FIG. 5, by setting the specific resistance of the P-type semiconductor substrate 11 in the range from about 300 Ωcm to about 2500 Ωcm, both inclusive, it is possible to provide a photodiode which can be adapted to a quadruple-speed DVD or a DVD having an even higher reproducing speed.

In this example, a structure in which the N-type diffusion regions 6 are formed in the surface of the N-type epitaxial layer 4 is described as a photodiode. However, the application of the present invention is not limited thereto. For example, there are no limitations on the structure of the photodiode sections, and the present invention is applicable to any other photodiode structure without causing any problem. This is also true of the following examples.

EXAMPLE 2

Figure 8:
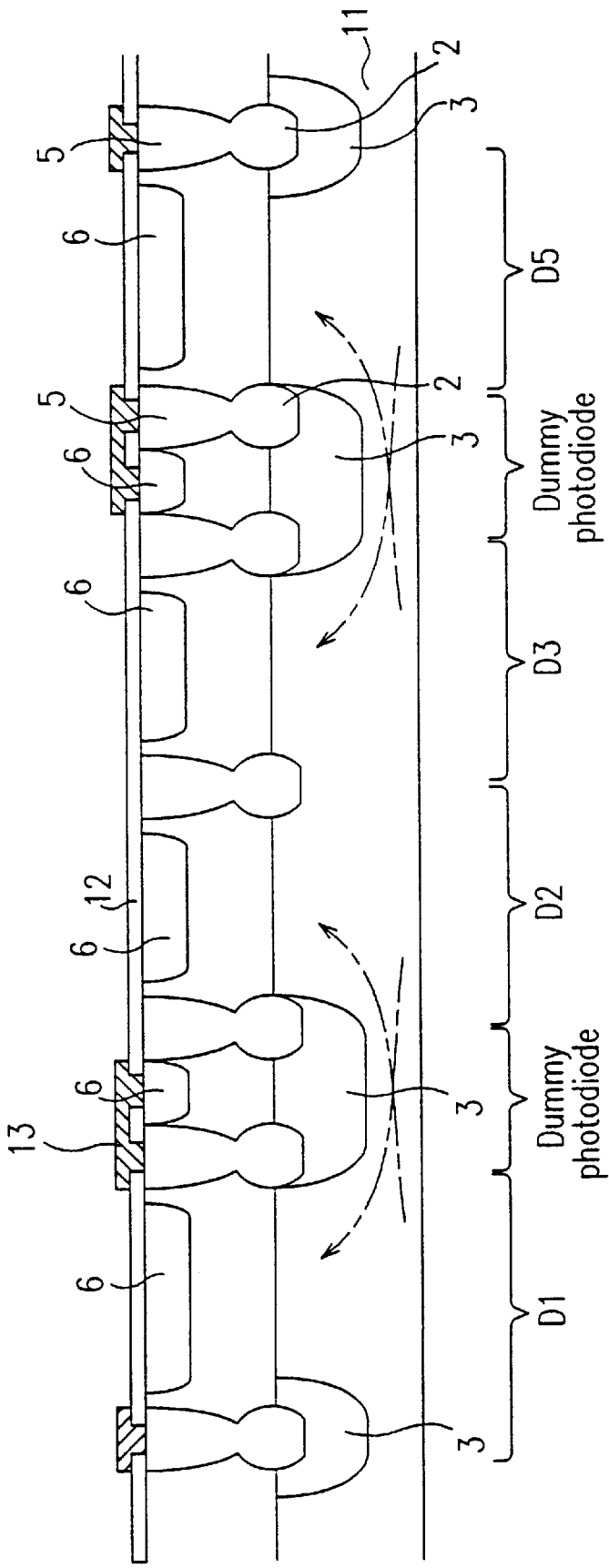
FIG. 8 is a cross-sectional view showing the structure of a divided photodiode in a second example of the present invention.

FIG. 8 shows an example in which the P-type buried diffusion regions 3 are applied to a structure in which dummy photodiodes having a short-circuited P-N junction are provided in a region between the light-detecting section D2 for obtaining a reproduced signal RF therefrom and the light-detecting section D1 for obtaining a tracking error signal TES therefrom and in a region between the light-detecting section D3 for obtaining a reproduced signal RF therefrom and the light-detecting section D5 for obtaining a tracking error signal TES therefrom.

The features of the structure of this example having dummy photodiodes will be described as for the dummy photodiode between the light-detecting sections D1 and D2. When the dummy photodiode does not exist between these light-detecting sections D1 and D2, the optical carriers move as indicated by the dashed-lines from the light-detecting section D2 toward the light-detecting section D1 and from the light-detecting section D1 toward the light-detecting section D2. However, if the dummy photodiode is formed, then such a movement of the optical carriers can be prevented, so that light can be detected stably.

The dummy photodiode between the light-detecting sections D3 and D5 also has the same features and the same effects.

It is noted that the present invention is also applicable to a photodiode having a structure other than that shown in FIG. 8 without causing any problem. In the structure shown in FIG. 8, the P-N junction of the dummy photodiode is short-circuited. However, the P-N junction is not necessarily required to be short-circuited and there occurs no problem if an appropriate reverse bias is applied thereto.

EXAMPLE 3

Next, a divided photodiode as a light-receiving element in the third example of the present invention will be described with reference to the drawings.

Figure 9:
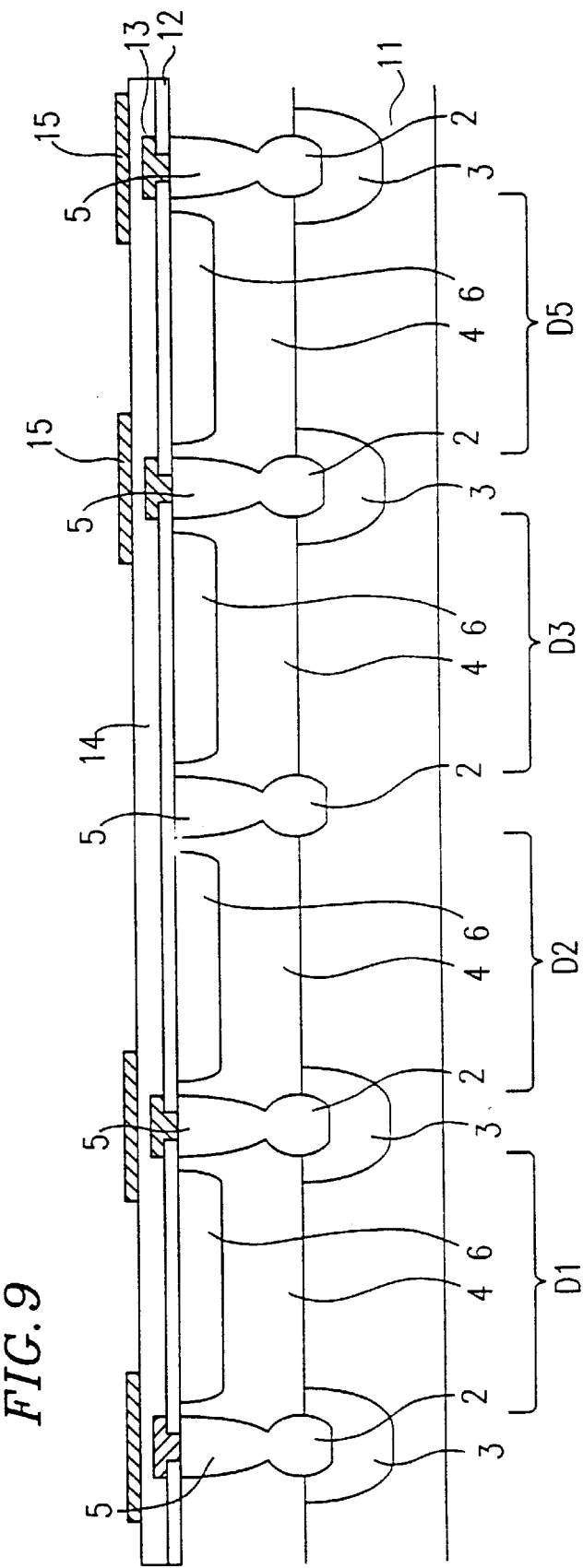
FIG. 9 is a cross-sectional view showing the structure of a divided photodiode in a third example of the present invention.

FIG. 9 is a cross-sectional view of the divided photodiode in the third example of the present invention.

In this divided photodiode, a light-blocking film 15 is formed over a pair of isolating diffusion regions 2 and 5 under which a P-type buried diffusion region 3 is formed. An insulating film 14 made of a transparent material causing no problems for light detection, e.g., silicon nitride, is formed under the light-blocking films 15 (on the side of the substrate 11). The light-blocking films 15 and the electrodes 13 are electrically isolated from each other by this insulating film 14.

The light-blocking films 15 are provided for the following reasons. Specifically, light is reflected and diffracted everywhere to generate stray light in an optical pickup system. Thus, by forming the light-blocking films 15 having a low light transmittance over the regions in which the buried diffusion regions 3 are formed as is done in this example, the light is prevented from penetrating into the buried diffusion regions 3. Thus, such a problem that the optical carriers generated under the buried diffusion region 3 make a detour around the buried diffusion region 3 can be eliminated.

The light-blocking films 15 are preferably made of a metal material having light-blocking properties. Alternatively, other materials may also be used so long as there occurs no problem regarding the light detection.

EXAMPLE 4

Figure 10:
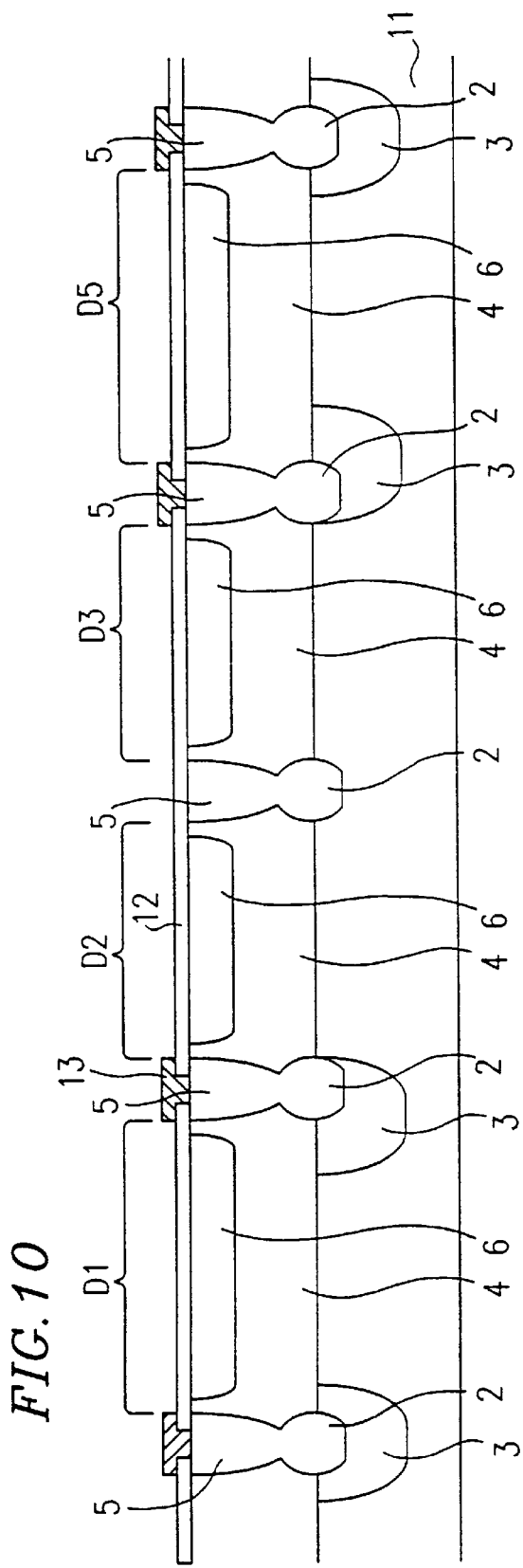
FIG. 10 is a cross-sectional view showing the structure of a divided photodiode in a fourth example of the present invention.

In the fourth example, another exemplary positional relationship between the P-type isolating diffusion region 2 and the P-type buried diffusion region 3 will be described. FIG. 10 is a cross-sectional view of the divided photodiode of this example.

As already described with reference to FIG. 18, the light-detecting sections requiring a particularly high response speed are the light-detecting sections D2, D3 and D4 for obtaining a reproduced signal RF. In this example, the P-type isolating diffusion regions 2 are formed such that the respective ends thereof are in contact with the end of the associated P-type buried diffusion regions 3 on the side closer to the light-detecting section D2 or D3 requiring a high response speed. As a result, the size of the light-detecting sections requiring a high response speed is minimized, thereby reducing the capacitance of the photodiode. Thus, the CR time constant can be reduced and the response speed of the photodiode can be increased.

In this case, the sizes of the photodiode sections for tracking, i.e., the light-detecting sections D1 and D5, are increased and accordingly the capacitance of the photodiode sections is increased. However, since the rate of the signal processed by the light-detecting sections D1 and D5 is lower than the rate for obtaining the reproduced signal RF from the light-detecting sections D2, D3 and D4 by over one digit, the increase in capacitance of these photodiode sections is negligible.

EXAMPLE 5

In this example, a structure in which a signal processor is formed in the vicinity of the divided photodiode in any of the foregoing examples will be described.

Figure 11:
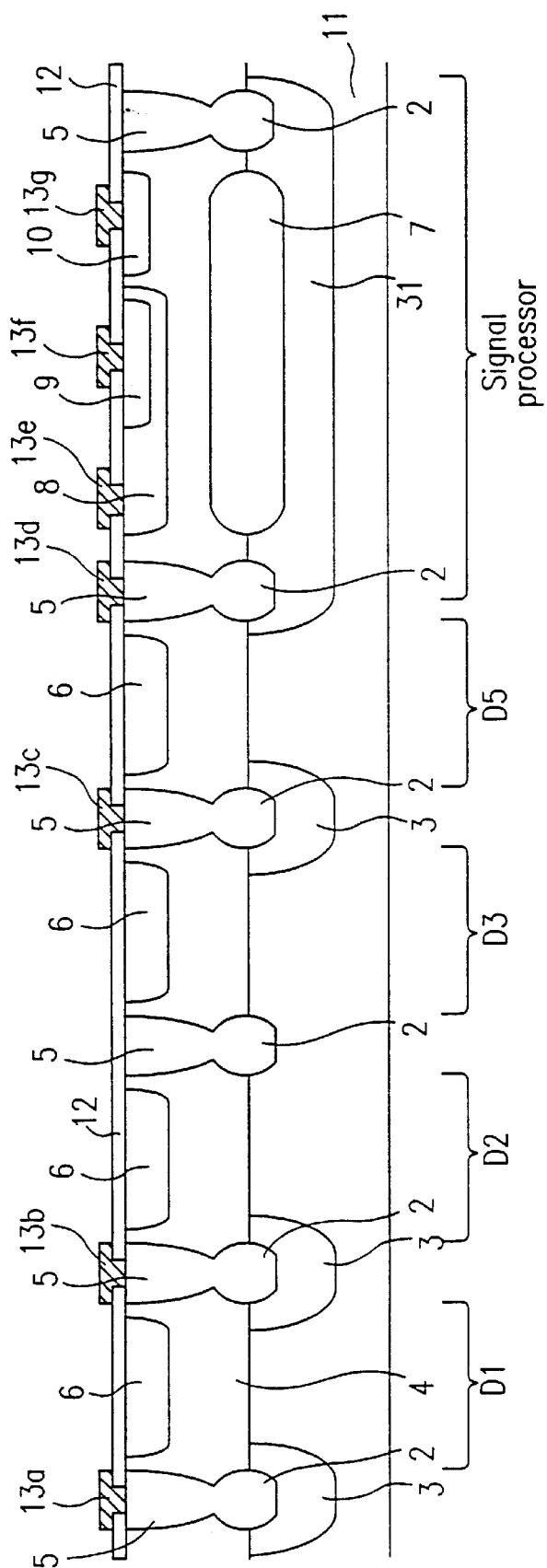
FIG. 11 is a cross-sectional view showing a structure of a divided photodiode in a fifth example of the present invention.

FIG. 11 is a cross-sectional view of the divided photodiode of this example, in which an NPN transistor is formed as a signal processor. It is noted that various components including multi-layer wires, protective films and the like to be formed during the respective process steps succeeding a metal wire processing step are omitted from FIG. 11.

In the divided photodiode, an N-type epitaxial layer 4 is formed on a P-type high-specific resistance semiconductor substrate 11 made of silicon, for example. Pairs of P-type isolating diffusion regions 2 and 5, which extend from the upper surface of the N-type epitaxial layer 4 to reach the regions at a level slightly lower than the surface of the semiconductor substrate 11, are formed in a plurality of regions. Each of the P-type isolating diffusion regions 2 is formed so as to extend from the region at a level slightly lower than the surface of the semiconductor substrate 11 and to reach the region in the middle of the N-type epitaxial layer 4. Each of the P-type isolating diffusion regions 5 is formed over the associated isolating diffusion region 2 so as to reach the upper surface of the N-type epitaxial layer 4.

The pairs of P-type isolating diffusion regions 2 and 5 divide the N-type epitaxial layer 4 into a plurality of regions (e.g., five regions in the example shown in FIG. 11) such that these regions are electrically isolated from each other. The outermost regions thereof are also electrically isolated from the adjacent regions. In FIG. 11, four leftmost regions out of the five regions isolated by the pairs of P-type isolating diffusion regions 2 and 5 become the respective light-detecting sections D1, D2, D3 and D5 of the photodiode. On the other hand, the rightmost region in FIG. 11 is an NPN transistor as a signal processor.

N-type diffusion regions 6 are formed in the upper part of the isolated light-detecting sections D1, D2, D3 and D5 in the vicinity of the surface of the N-type epitaxial layer 4. The light-detecting sections D1 and D5 are regions from which a tracking error signal TES is to be obtained. In each of the light-detecting section D1 and D5, light is irradiated substantially onto the center thereof. The light-detecting sections D2 and D3 are regions from which a focus error signal FES is to be obtained. In the light-detecting section D2 and D3, light is irradiated mainly onto the isolating section thereof.

In addition, in the region in which the NPN transistor is to be formed, an N-type buried diffusion region 7 is formed over a part of the semiconductor substrate 11 and a part of the N-type epitaxial layer 4. In the upper region of the N-type epitaxial layer 4, a P-type diffusion region 8 to be a base and N-type diffusion regions 9 and 10 to be an emitter take-out diffusion region and a collector take-out diffusion region, respectively, are formed.

An oxide film 12 is formed on the N-type epitaxial layer 4. Seven electrodes 13 for taking out a substrate potential therethrough are provided through the oxide film 12. Herein, when these electrodes are sequentially numbered by 13a, 13b, 13c, 13d, 13e, 13f and 13g, respectively, from left to right in FIG. 11, the electrodes 13a to 13d are provided over all of the isolating diffusion regions 5, except for the isolating diffusion region 5 between the light-detecting sections D2 and D3. The electrodes 13e to 13g are formed over the P-type diffusion region 8 and the N-type diffusion regions 9 and 10 in the region in which the NPN transistor is to be formed.

The lower end of each of the electrodes 13a to 13d in the regions for the light-detecting sections reaches the associated P-type isolating diffusion region 5. On the other hand, the lower end of the electrodes 13e to 13g in the region in which the NPN transistor is to be formed reach the P-type diffusion region 8 and the N-type diffusion regions 9 and 10, respectively. Furthermore, P-type buried diffusion regions 3 are formed under the isolating diffusion regions 2 corresponding to the three leftmost isolating diffusion regions 5 provided with the electrodes 13a to 13c, respectively. Furthermore, a P-type buried diffusion region 31 including the lower ends of two rightmost P-type isolating diffusion regions 2 is formed under the N-type buried diffusion region 7 between the two rightmost pairs of P-type isolating diffusion regions 2 and 5.

Next, a method for fabricating the divided photodiode having such a structure will be described with reference to the cross-sectional views shown in FIGS. 12A and 12B. It is noted that the same components are identified by the same reference numerals in FIG. 11 and FIGS. 12A and 12B.

Figure 12A:
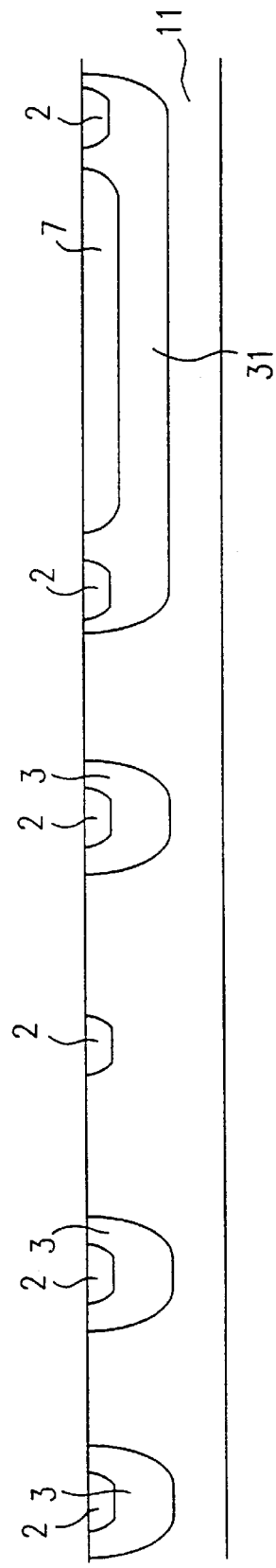
FIGS. 12A and 12B are cross-sectional views showing the process steps for fabricating the divided photodiode shown in FIG. 11.

First, as shown in FIG. 12A, P-type buried diffusion regions 3 are formed in the regions to be the isolating sections for isolating the light-detecting sections D1 to D5 from each other (except for the isolating section between the light-detecting sections D2 and D3 onto which light is irradiated during practical use) in the surface of the P-type high-specific resistance semiconductor substrate 11 made of silicon, for example.

Next, the P-type buried diffusion region 31 is formed in the region in which a signal processor is to be formed. The P-type buried diffusion region 31 is provided for preventing a latch-up phenomenon, which is more likely to occur due to a high specific resistance of the substrate 11. In this example, the P-type buried diffusion regions 3 and the P-type buried diffusion region 31 are separately formed. However, the present invention is not limited thereto. Thus, there is no problem if the P-type buried diffusion regions 3 and 31 are simultaneously formed. Rather, the number and the costs of the fabrication process steps can be advantageously reduced by forming the P-type buried diffusion regions 3 and 31 simultaneously.

Next, P-type isolating diffusion regions 2 are formed in the regions corresponding to the isolating sections which isolate the light-detecting sections D1 to D5 from each other and in the regions for isolating the respective devices of the signal processor from each other. In this process step, an N-type buried diffusion region 7 for reducing the collector resistance of an NPN transistor is formed in a part of the region in which the signal processor is to be formed.

Figure 12B:
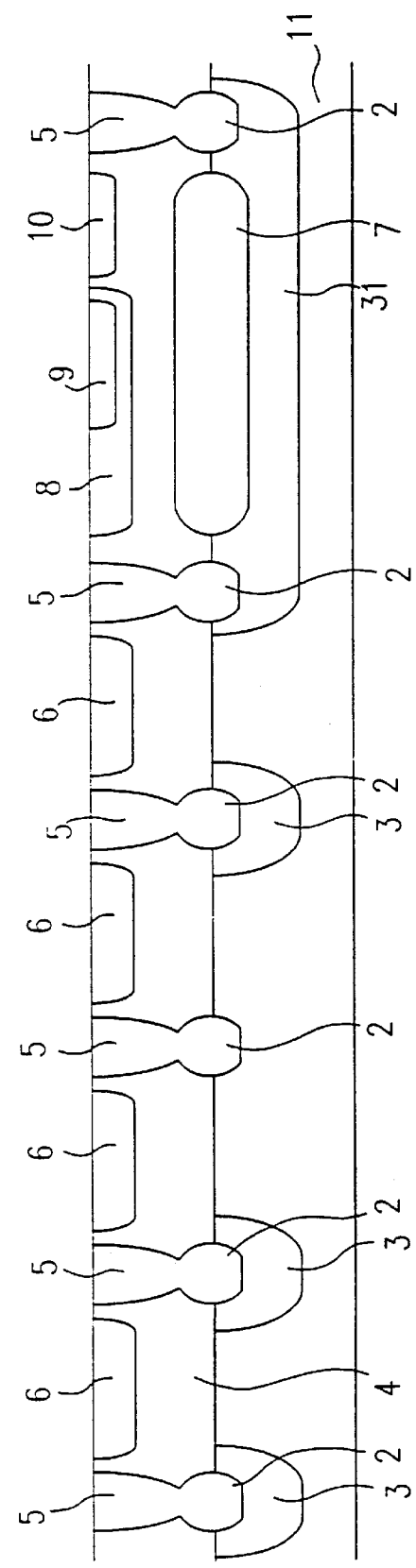

Then, as shown in FIG. 12B, an N-type epitaxial layer 4 is formed over the entire surface of the P-type high-specific resistance semiconductor substrate 11. Subsequently, P-type isolating diffusion regions 5 are formed in the regions inside the N-type epitaxial layer 4 which correspond to the respective P-type isolating diffusion regions 2. These P-type isolating diffusion regions 5 are formed so as to extend from the upper surface of the N-type epitaxial layer 4 and to reach the respective P-type isolating diffusion regions 2. It is noted that, in this process step, the respective isolating diffusion regions 2 diffusively expand from inside the semiconductor substrate 11 toward the N-type epitaxial layer 4. By forming these pairs of P-type isolating diffusion regions 2 and 5, the N-type epitaxial layer 4 is divided into a plurality of electrically isolated N-type semiconductor regions to form the respective light-detecting sections D1 to D5 (note that D4 is not shown in these figures) and an electrically isolated signal processor.

Next, N-type diffusion regions 6 are formed in the regions of the N-type epitaxial layer 4 which correspond to the respective divided photodiode sections. These N-type diffusion regions 6 are provided for the purposes of reducing the serial resistance of the photodiode, thereby reducing the CR time constant and realizing high-speed response characteristics. On the other hand, in the signal processor section, the P-type diffusion region 8 to be a base and the N-type diffusion regions 9 and 10 to be an emitter take-out diffusion region and a collector take-out diffusion region, respectively, are sequentially formed in the predetermined regions under the surface of the N-type epitaxial layer 4.

Finally, as shown in FIG. 11, the oxide film 12 and the electrodes 13a to 13g are formed, thereby completing the light-detecting divided photodiode of this example shown in FIG. 11.

In the divided photodiode thus fabricated, the light-detecting divided photodiode section and the signal processor section are formed on the same silicon substrate. Thus, the finished size can be reduced and an optical pickup device can be downsized, as compared with the case of forming these two sections separately.

In addition, since the light-detecting divided photodiode section and the signal processor section are formed on the same silicon substrate, it is possible to connect the divided photodiode section and the signal processor section by using metal wiring. Thus, as compared with the case of connecting these sections via wires, the resultant device becomes less vulnerable against external noise, and the operational characteristics thereof are not deteriorated due to inductance of the wires and the like during a high-speed operation. Furthermore, since the photodiode and the signal processor can be connected via short metal wiring, associated wiring capacitance can be reduced and a high-speed operation is realized.

Figure 13:
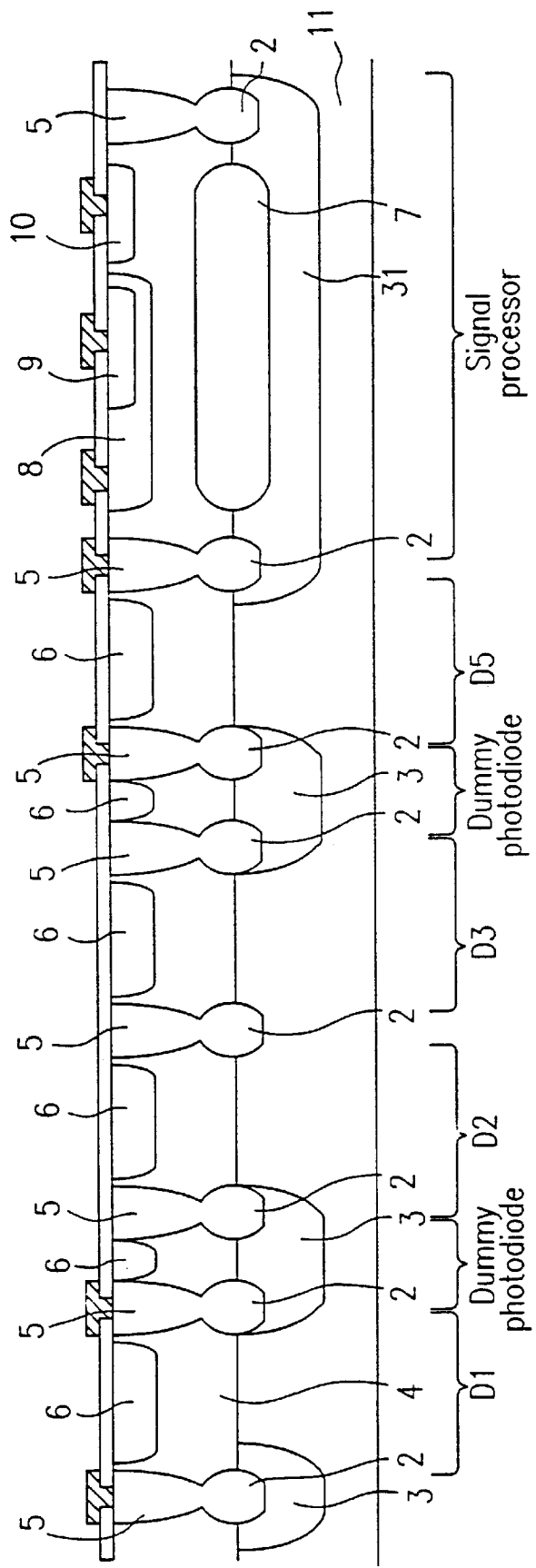
FIG. 13 is a cross-sectional view showing another structure of a divided photodiode in a fifth example of the present invention.

FIG. 13 is a cross-sectional view showing a case where the above-described structure of this example is applied to a divided photodiode including the dummy photodiodes shown in FIG. 8. In the example shown in FIG. 13, the divided photodiode section and the signal processor section are also formed on the same silicon substrate.

As described above, according the present invention, the light-detecting divided photodiode section and the signal processor section can be formed on the same substrate for divided photodiodes having various types of structures.

In this example, in order to suppress the influence of a boron autodoped layer forming between the N-type epitaxial layer 4 and the P-type semiconductor substrate 11, the N-type epitaxial layer 4 is formed so as to have an impurity concentration of about $5 \times 10^{15}$ atoms/cm$^3$ or more.

As described above, in an epitaxial growth process for forming the N-type epitaxial layer 4, a boron autodoping phenomenon resulting from the outward diffusion of the impurity from the P-type buried diffusion regions 3 and 31 occurs. A boron autodoping phenomenon causes, in particular, the response speed of the photodiode to be decreased. Thus, in this example, by forming the N-type epitaxial layer 4 so as to have a concentration of about $5 \times 10^{15}$ atoms/cm$^3$ or more, the N-type impurities (e.g., phosphorous) in the N-type epitaxial layer 4 are allowed to diffuse into the P-type semiconductor substrate 11 by performing a heat treatment for the isolation diffusion or the like after the epitaxial growth has been completed. As a result, it is possible to prevent the boron autodoped layer from adversely affecting the photodiode.

Figure 14:
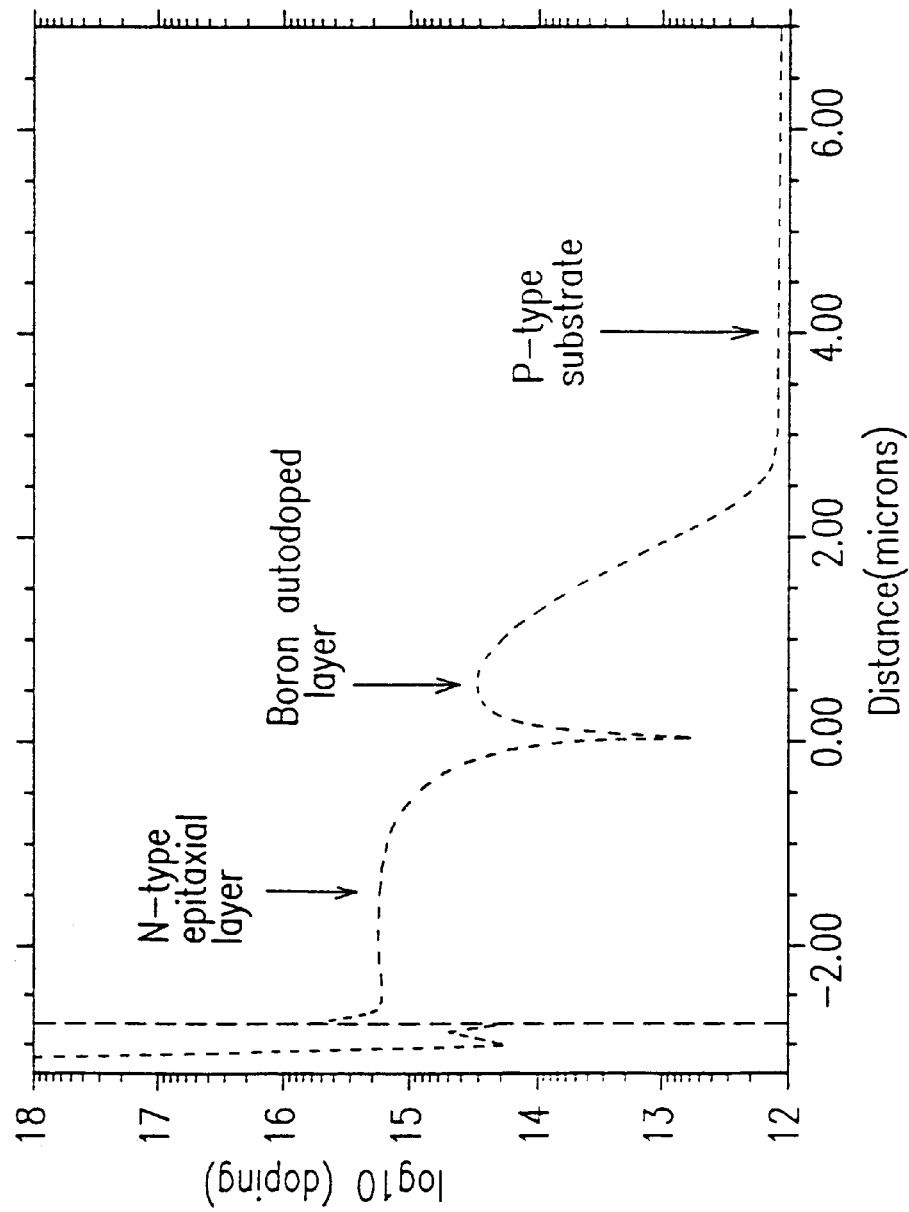
FIG. 14 is an impurity concentration profile when the impurity concentration of the N-type epitaxial layer is about $1.7 \times 10^{15}$ atoms/cm$^3$.
Figure 15:
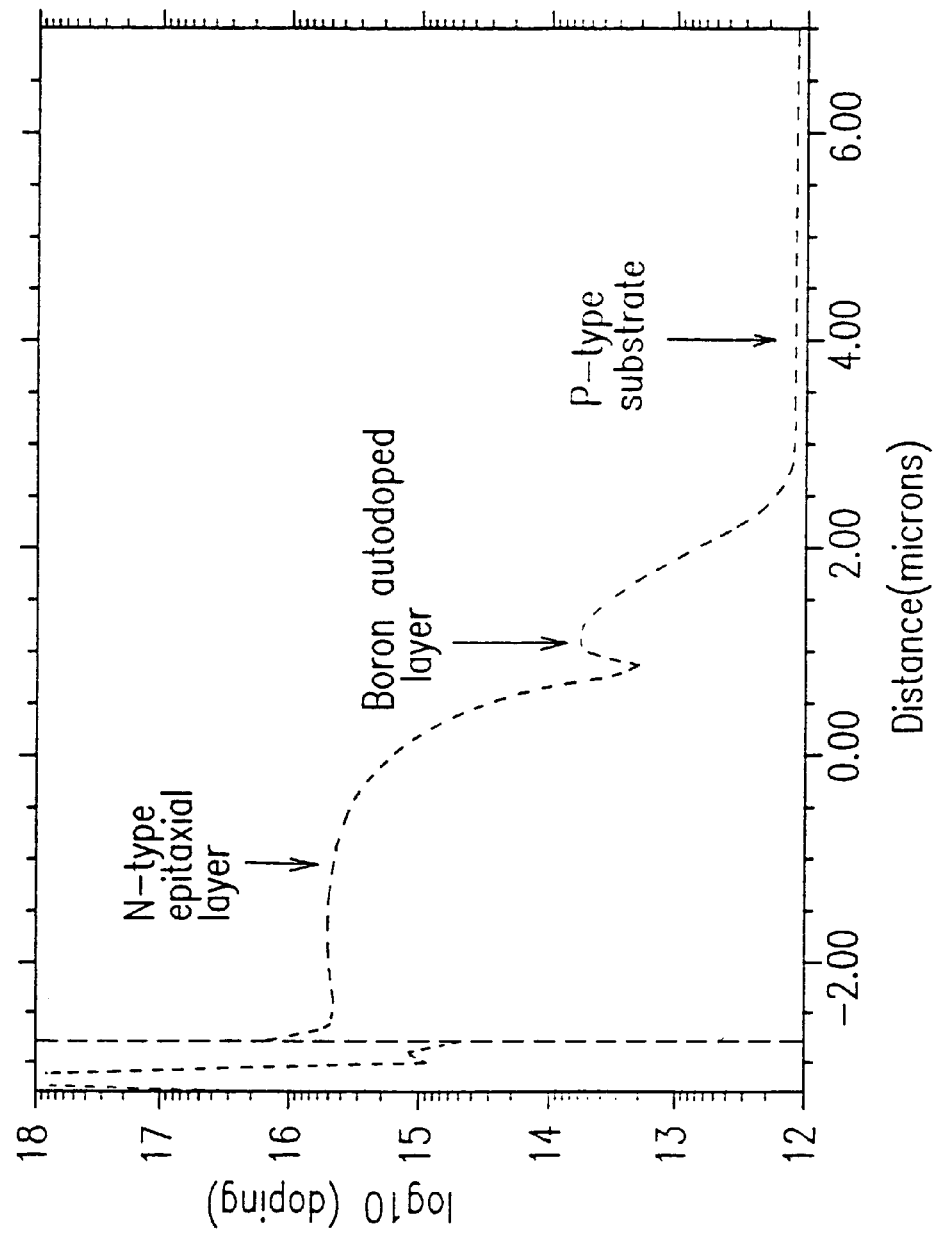
FIG. 15 is an impurity concentration profile when the impurity concentration of the N-type epitaxial layer is about $5.0 \times 10^{15}$ atoms/cm$^3$.

FIGS. 14 and 15 are graphs showing the analysis results obtained by performing device simulations.

Specifically, FIGS. 14 and 15 show the results of the device simulations performed for the structures in which an N-type epitaxial layer having a thickness of about 3 μm is grown on a P-type substrate having a specific resistance of about 10,000 Ωcm. In these figures, a depth of 0 μm represents the interface between the substrate and the epitaxial layer. A boron autodoped layer having a surface impurity concentration of about $5.0 \times 10^{14}$ atoms/cm$^3$ is intentionally generated in the interface between the substrate and the epitaxial layer. FIG. 14 shows an impurity concentration profile of a photodiode section in the depth direction when the impurity concentration of the N-type epitaxial layer 4 is about $1.7 \times 10^{15}$ atoms/cm$^3$, and FIG. 15 shows an impurity concentration profile of a photodiode section in the depth direction when the impurity concentration of the N-type epitaxial layer 4 is about $5.0 \times 10^{15}$ atoms/cm$^3$.

As shown in FIG. 15, if the impurity concentration of the N-type epitaxial layer 4 is about $5.0 \times 10^{15}$ atoms/cm$^3$, only a boron autodoped layer having an impurity concentration of about $5.0 \times 10^{13}$ atoms/cm$^3$ and a width of about 1 μm exists in the lower part of the N-type epitaxial layer 4. This autodoped layer is completely depleted by applying a reverse bias of about 1.5 V to the photodiode. Thus, problems such as an increase in capacitance of the photodiode and a decrease in response speed thereof can be eliminated.

Thus, by forming the N-type epitaxial layer 4 so as to have an impurity concentration of about $5.0 \times 10^{15}$ atoms/cm$^3$ or more, it is possible to prevent the response speed of the photodiode from being decreased by the generation of the boron autodoped layer.

Figure 16:
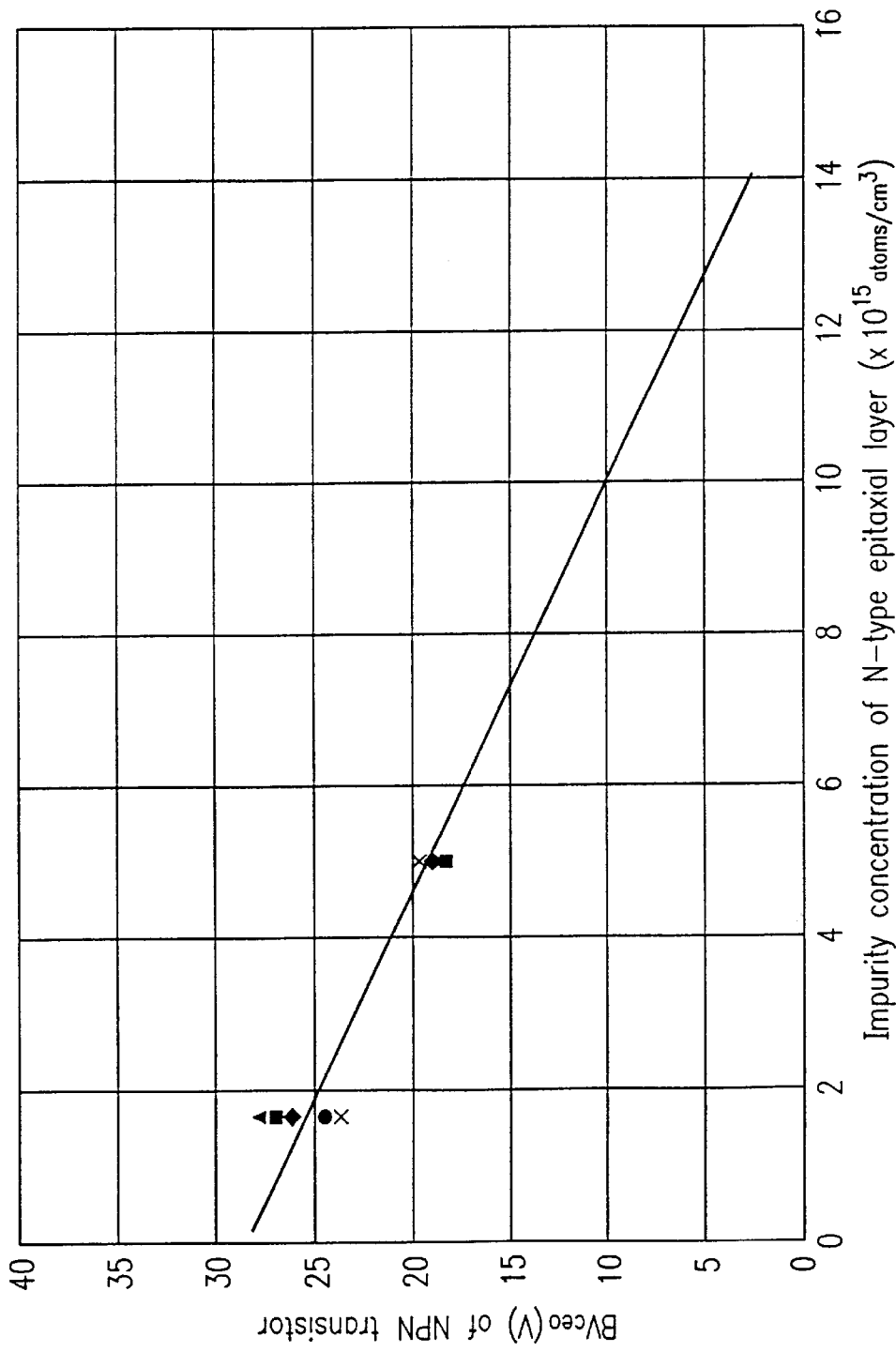
FIG. 16 is a graph showing breakdown voltage characteristics of an NPN transistor with respect to the impurity concentration of the N-type epitaxial layer.

However, if the impurity concentration of the N-type epitaxial layer is further increased, then some problems are caused. Specifically, in the NPN transistor formed around the divided photodiode section, breakdown voltage characteristics between the collector and the emitter thereof are deteriorated. The measured results of the breakdown voltages are shown in FIG. 16. As can be seen from FIG. 16, when the impurity concentration of the N-type epitaxial layer 4 reaches about $13 \times 10^{15}$ atoms/cm$^3$, the breakdown voltage thereof becomes lower than 5 V. As a result, the NPN transistor cannot be applied to products of a 5V power supply voltage type.

Thus, the impurity concentration of the N-type epitaxial layer 4 is preferably set in the range from about $5 \times 10^{15}$ atoms/cm$^3$ to about $13 \times 10^{15}$ atoms/cm$^3$.

EXAMPLE 6

In this example, a structure from which the buried diffusion regions are omitted will be described.

Figure 17:
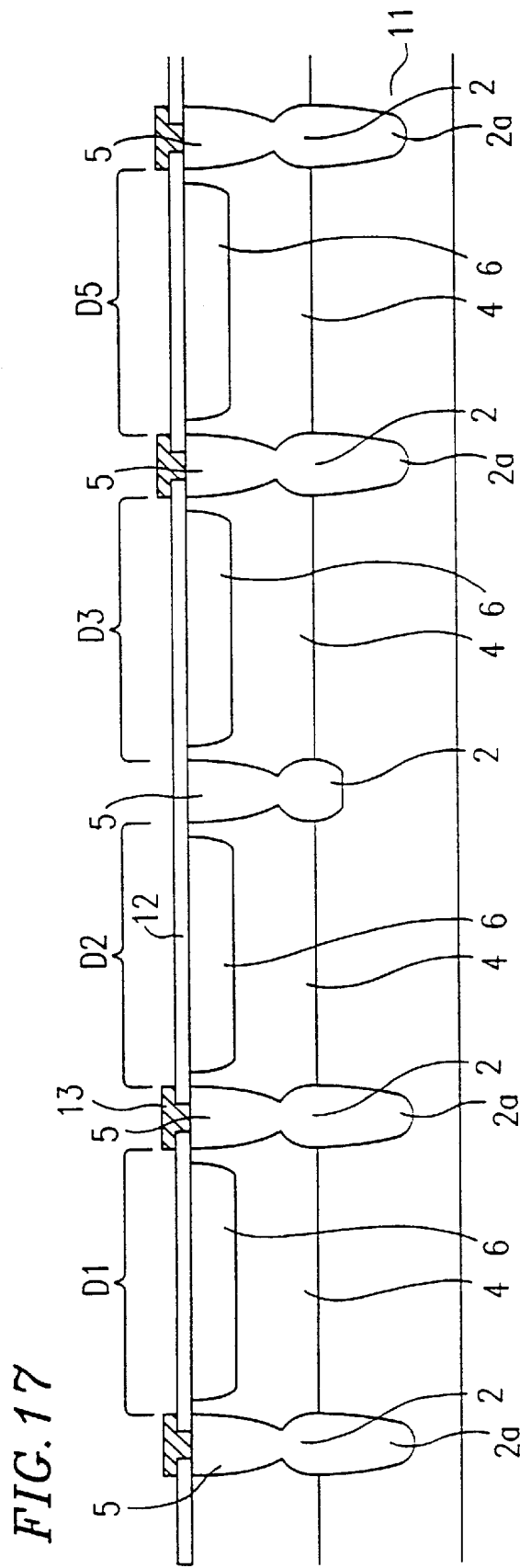
FIG. 17 is a cross-sectional view showing the structure of a divided photodiode in a sixth example of the present invention.

FIG. 17 is a cross-sectional view showing the divided photodiode of this example. The divided photodiode basically has a similar structure to that of the divided photodiode shown in FIG. 1. However, in the divided photodiode shown in FIG. 17, the isolating diffusion regions 2 are formed such that the lower end thereof reaches at an even lower level as compared with the surface of the substrate 11. The isolating diffusion regions 2 having such a characteristic shape realize the same functions as those of the buried diffusion regions. Such a deep diffusion region 2a having a narrow lateral width is formed by implanting ions having a high energy of about 1 MeV (the depth of the peak of the impurity concentration: $R_p$=about 2.32 μm; and the σ value of the impurity in the depth direction: $\Delta R_p$=about 0.18 μm) or more.

In such a structure, the same functions and effects as those of the divided photodiode shown in FIG. 1 can be attained. However, in order to attain the same functions and effects as those of the divided photodiode shown in FIG. 1, the lower end of the isolating diffusion region 2 is preferably located at the same level as that of the lower end of the buried diffusion region 3 of the divided photodiode shown in FIG. 1.

In this example, the structural features of this example are applied to the divided photodiode shown in FIG. 1. However, the technological features of this example are applicable not only to the divided photodiode shown in FIG. 1, but also to divided photodiodes having other types of structures. For example, these features are applicable to the divided photodiode shown in FIGS. 3, 4 and 10, and to the divided photodiode section shown in FIGS. 11 and 13 which is formed together with the signal processor section on the same substrate.

In the foregoing description, the conductivity type of the semiconductor substrate 11 as well as the isolating diffusion regions 2 and 5 and the like is assumed to be P-type, and the conductivity type of the epitaxial layer 4 as well as the diffusion region 6 and the like is assumed to be N-type. However, the application of the present invention is not limited thereto. It is also possible to assume the conductivity type of the semiconductor substrate 11 as well as the isolating diffusion regions 2 and 5 and the like to be N-type, and the conductivity type of the epitaxial layer 4 as well as the diffusion region 6 and the like to be P-type.

Figure 18:
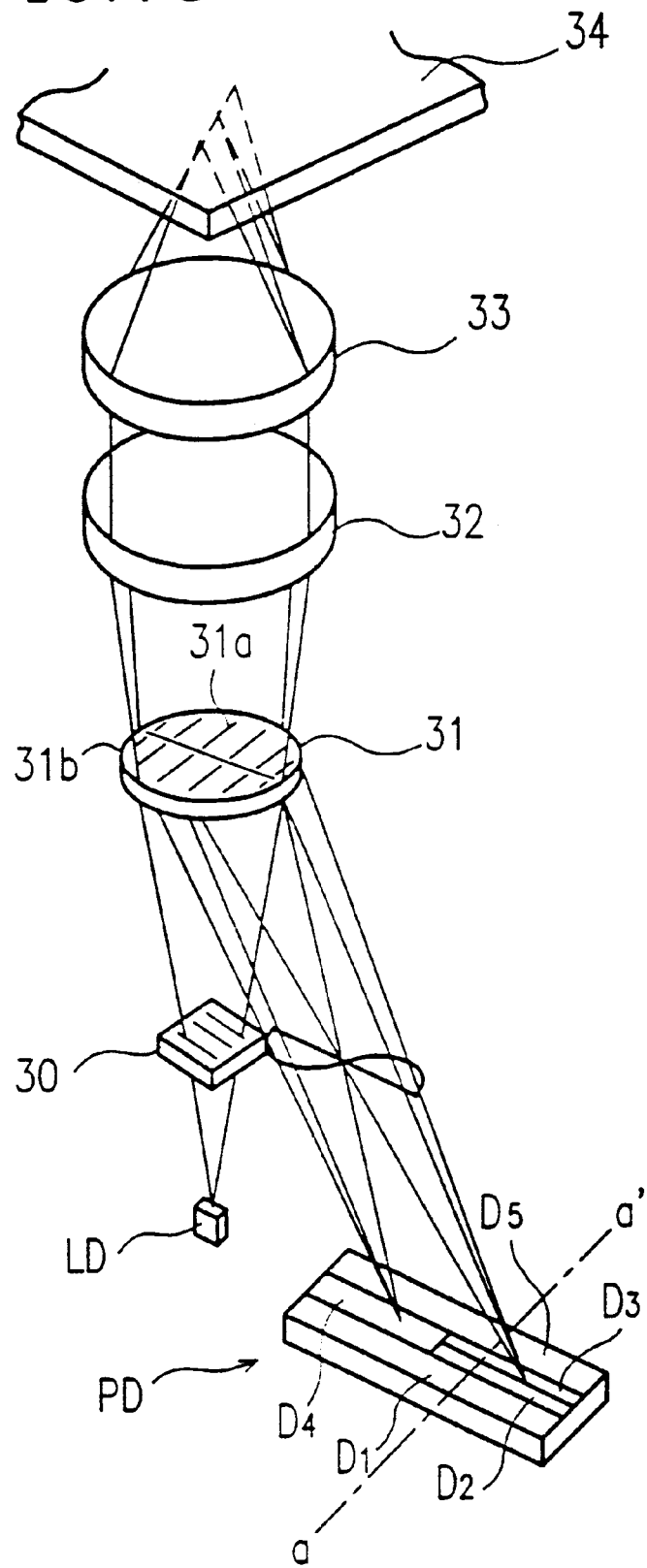
FIG. 18 is a schematic view showing the arrangement of an optical system for an optical pickup device using a hologram element.
Figure 21A:
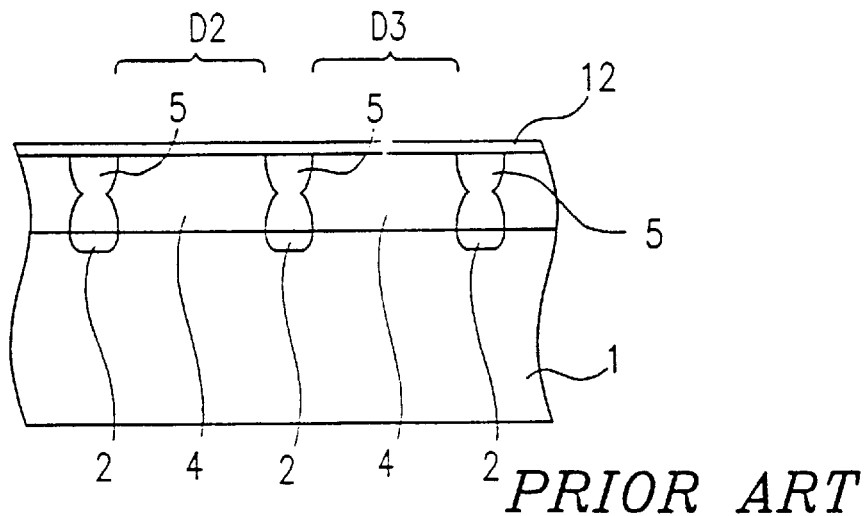
FIG. 21A is a cross-sectional view showing a part of the divided photodiode shown in FIG. 19.
Figure 21B:
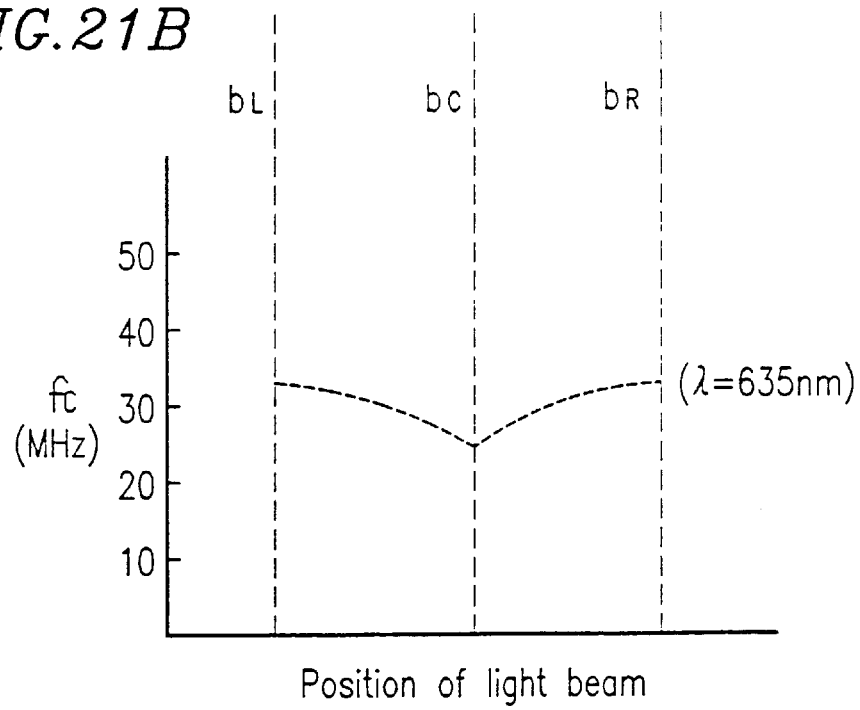
FIG. 21B is a graph showing the dependence of the cutoff frequency of the divided photodiode shown in FIG. 19 upon the position of a light beam.

In the foregoing description, the present invention has been described as being applied to a divided photodiode including five light-detecting sections as shown in FIG. 18. However, the application of the present invention is not limited thereto. Alternatively, the present invention is applicable to any divided photodiode as long as the divided photodiode includes a combination of a plurality of light-detecting sections, which are adjacent to each other via an isolating section, wherein light is irradiated on the isolating section, even if the specific structure thereof is different from the exemplified ones.

Figure 26B:
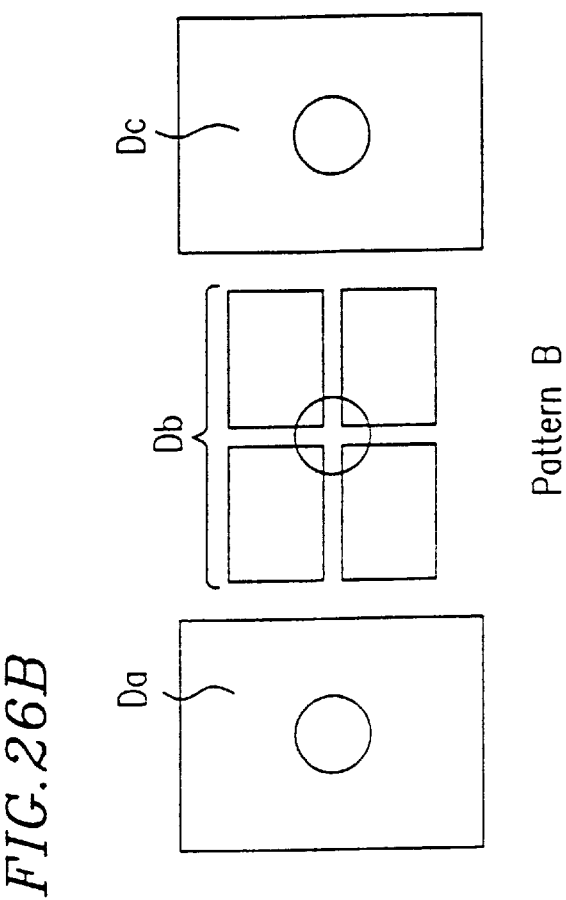
FIGS. 26A and 26B schematically illustrate, respectively, exemplary arrangements of light-detecting sections of divided photodiodes to which the present invention is applicable.
Figure 26A:
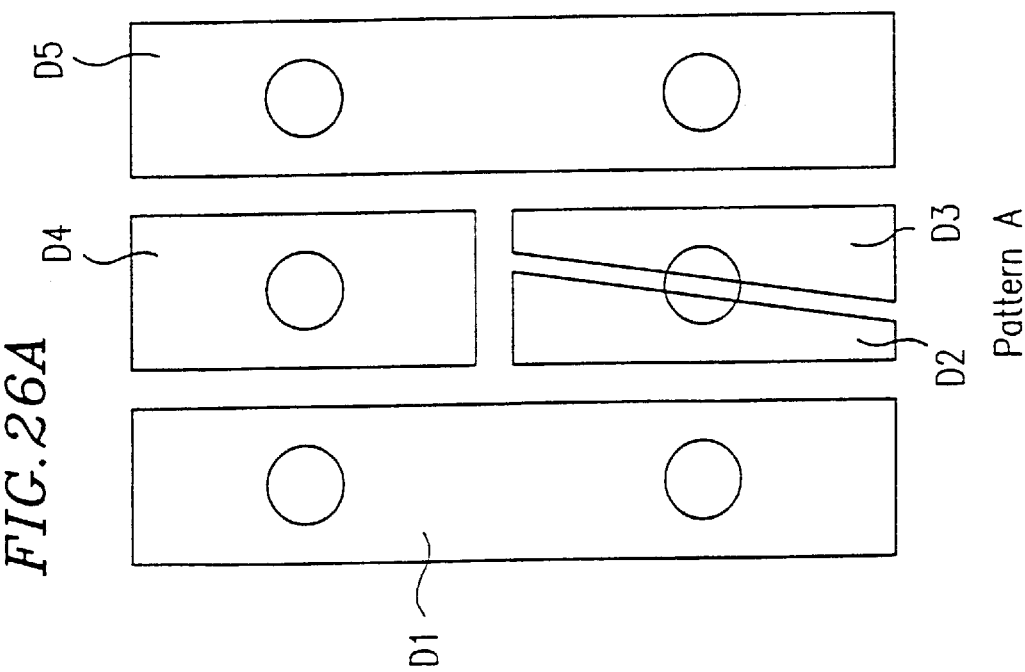

For example, FIG. 26A illustrates, as "pattern A", the arrangement of the five light-detecting sections D1 through D5 in the divided photodiode as shown in FIG. 18. Instead of this arrangement, the present invention is also applicable to the photodiode arrangement as illustrated in FIG. 26B as "pattern B", and the same advantages as set forth above can be achieved in this case.

In the arrangement of FIG. 26B, a combination of four light-detecting sections Db is provided so as to be interposed between two light-detecting sections Da and Dc. In this arrangement, the combination of the light-detecting sections Db corresponds to a pair of the light-detecting sections D2 and D3 in the arrangement of FIG. 26A. Circles in FIGS. 26A and 26B respectively represent light irradiation spots.

As has been described in detail, the present invention provides buried diffusion regions in the regions of the semiconductor substrate under the isolating diffusion regions from which the substrate potential of the divided photodiode is to be taken out. This prevents the regions of the semiconductor substrate under the isolating diffusion regions from being depleted by the application of a reverse bias thereto. Thus, since the serial resistance of the photodiode is not increased by the formation of the depletion layer, the cutoff frequency and the response speed of the divided photodiode can be increased.

In addition, by setting the specific resistance of the semiconductor substrate to be high, the depletion layer can expand over a wider area when light is irradiated onto an isolating section in a combination of a plurality of the semiconductor regions which are adjacent to each other via the isolating section. Thus, the end of the depletion layer largely expands to the region below the isolating diffusion region. As a result, the detour of optical carriers can be suppressed and the diffusion movement distance thereof can be shortened. Consequently, the cutoff frequency and the response speed of the divided photodiode can also be increased.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A divided photodiode, comprising:
   a semiconductor substrate of a first conductivity type;
   a semiconductor layer of a second conductivity type, the semiconductor layer being formed on a surface of the semiconductor substrate;
   a plurality of isolating diffusion regions of the first conductivity type, each of the isolating diffusion regions comprising at least one layer, the plurality of isolating diffusion regions being formed in a plurality of regions in the semiconductor layer to respectively extend from a surface of the semiconductor layer opposite to another surface of the semiconductor layer that is in contact with a surface of the semiconductor substrate and to reach regions under the surface of the semiconductor substrate, the plurality of isolating diffusion regions dividing the semiconductor layer into at least three semiconductor regions of the second conductivity type, the plurality of isolating diffusion regions further being divided into a first group and a second group, the isolating diffusion region of the first group being disposed to be irradiated with light together with semiconductor regions adjacent to said first group the isolating diffusion regions of the second group being disposed to divide the semiconductor regions adjacent to the isolating diffusion region of the first group from other semiconductor regions not adjacent to the isolating diffusion region of the first group,
   wherein at least one first buried diffusion region of the first conductivity type is formed under each of the isolating diffusion regions of the second group to prevent portions of the semiconductor substrate under the isolating diffusion regions of the second group from being depleted by the application of a reverse bias, and no first buried diffusion region is disposed under the isolating diffusion region of the first group.

2. A divided photodiode according to claim 1, wherein semiconductor substrate has a specific resistance of 100 Ωcm or more.

3. A divided photodiode according to claim 1, wherein a light-blocking film for suppressing irradiation of stray light onto the first buried diffusion regions is formed over the isolating diffusion regions of the second group.

4. A divided photodiode according to claim 1, wherein the first buried diffusion regions are formed to have a diffusion depth Xj equal to or larger than 5 $\mu$m.

5. A divided photodiode according to claim 1, wherein the first buried diffusion regions are formed to have a concentration of $1 \times 10^{17}$ atoms/cm$^3$ or less at the surface of the semiconductor substrate prior to formation of the semiconductor layer of the second conductivity type on the surface of the semiconductor substrate.

6. A divided photodiode according to claim 1, wherein the first buried diffusion regions and the isolating diffusion regions of the second group are formed to have a concentration of $5 \times 10^{14}$ atoms/cm$^3$ or more in a contact region therebetween.

7. A divided photodiode according to claim 1, wherein each of the first buried diffusion regions and the isolating diffusion regions of the second group are formed by contacting one end of the first buried diffusion region with one end of the a corresponding isolating diffusion region located closer to the isolating diffusion region of the first group.

8. A divided photodiode according to claim 1, wherein the semiconductor substrate and the semiconductor layer exist in a range wider than the at least three semiconductor regions, and a signal processor is formed outside of the at least three semiconductor regions.

9. A divided photodiode according to claim 8, wherein the signal processor comprises a second buried diffusion region of the first conductivity type, and the second buried diffusion region is formed simultaneously with the first buried diffusion regions.

10. A divided photodiode according to claim 8, wherein an impurity concentration of the semiconductor layer of the second conductivity type is set at $5 \times 10^{15}$ atoms/cm$^3$ or more to prevent boron autodoping from the first buried diffusion regions.

11. A divided photodiode, comprising:
    a semiconductor substrate of a first conductivity type;
    a semiconductor layer of a second conductivity type, the semiconductor layer being formed on a surface of the semiconductor substrate; and
    a plurality of isolating diffusion regions of the first conductivity type, each of the isolating diffusion regions comprising at least one layer, the plurality of isolating diffusion regions being formed in a plurality of regions in the semiconductor layer to respectively extend from a surface of the semiconductor layer opposite to another surface of the semiconductor layer that is in contact with a surface of the semiconductor substrate and to reach regions under the surface of the semiconductor substrate, the plurality of isolating diffusion regions dividing the semiconductor layer into at least three semiconductor regions of the second conductivity type, the plurality of isolating diffusion regions further being divided into a first group and a second group, the isolating diffusion region of the first group being disposed to be irradiated with light together with semiconductor regions adjacent to said first group, the isolating diffusion regions of the second group being disposed to divide the semiconductor regions adjacent to the isolating diffusion region of the first group from other semiconductor regions not adjacent to the isolating diffusion region of the first group,
    wherein each of the isolating diffusion regions of the second group is formed to reach a first level under the surface of the semiconductor substrate to prevent portions of the semiconductor substrate under the respective isolating diffusion regions of the second group from being depleted, and the isolating diffusion region of the first group is formed to reach a second level under the surface of the semiconductor substrate, the second level being shallower than the first level.

12. A divided photodiode according to claim 11, wherein the semiconductor substrate and the semiconductor layer exist in a range wider than the at least three semiconductor regions, and a signal processor is formed outside of the at least three semiconductor regions.

13. A divided photodiode according to claim 12, wherein the signal processor comprises a buried diffusion region of the first conductivity type.

14. A divided photodiode according to claim 11, wherein the first level is positioned at a depth equal to or larger than 5 μm from the surface of the semiconductor substrate.

15. A divided photodiode, comprising:
- a semiconductor substrate of a first conductivity type;
- a semiconductor layer of a second conductivity type formed on a surface of the semiconductor substrate;
- a plurality of isolating diffusion regions of the first conductivity type, each comprising at least one layer, the plurality of isolating diffusion regions being formed in a plurality of regions in the semiconductor layer to extend from a surface of the semiconductor layer opposite the surface of the semiconductor layer that is in contact with the semiconductor substrate, the plurality of isolating diffusion regions dividing the semiconductor layer into a plurality of regions of the second conductivity type, the plurality of isolating diffusion regions comprising a first group and a second group, the isolating diffusion region of the first group being disposed to be irradiated with light together with semiconductor regions adjacent to the first group, the isolating diffusion regions of the second group being disposed to divide the semiconductor regions adjacent to the isolating diffusion region of the first group from other semiconductor regions not adjacent to the isolating diffusion region of the first group,
- wherein at least one first buried diffusion region of the first conductivity type is formed under each of the isolating diffusion regions of the second group.

16. A divided photodiode, comprising:
- a semiconductor substrate of a first conductivity type;
- a semiconductor layer of a second conductivity type, the semiconductor layer being formed on a surface of the semiconductor substrate; and
- a plurality of isolating diffusion regions of the first conductivity type, each of the isolating diffusion regions comprising at least one layer, the plurality of isolating diffusion regions being formed in a plurality of regions in the semiconductor layer to respectively extend from a surface of the semiconductor layer opposite to that surface of the semiconductor layer that is in contact with a surface of the semiconductor substrate and to reach regions under the surface of the semiconductor substrate, the plurality of isolating regions dividing the semiconductor layer into at least three semiconductor regions of the second conductivity type, the plurality of isolating diffusion regions being further divided into a first group and a second group, the isolating diffusion region of the first group being disposed to be irradiated with light together with semiconductor regions adjacent to said first group, the isolating diffusion regions of the second group being disposed to divide the semiconductor regions adjacent to the isolating diffusion region of the first group from other semiconductor regions not adjacent to the isolating diffusion region of the first group,
- wherein each of the isolating diffusion regions of the second group is formed to reach a level under the surface of the semiconductor substrate to prevent portions of the semiconductor substrate under the respective isolating diffusion regions of the second group from being depleted.

\* \* \* \* \*